(12) United States Patent
Heo et al.

(10) Patent No.: US 12,243,489 B2
(45) Date of Patent: Mar. 4, 2025

(54) GATE DRIVING CIRCUIT AND DISPLAY DEVICE INCLUDING THE SAME

(71) Applicant: LG DISPLAY CO., LTD., Seoul (KR)

(72) Inventors: Seung Ho Heo, Paju-si (KR); Dong Hyun Lee, Paju-si (KR); Seok Noh, Paju-si (KR); Ki Min Son, Paju-si (KR); Hun Ki Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 443 days.

(21) Appl. No.: 17/848,175

(22) Filed: Jun. 23, 2022

(65) Prior Publication Data

US 2023/0010792 A1    Jan. 12, 2023

(30) Foreign Application Priority Data

Jul. 8, 2021 (KR) .......................... 10-2021-0089994
Dec. 2, 2021 (KR) .......................... 10-2021-0170668

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2300/0819* (2013.01);
(Continued)

(58) Field of Classification Search
CPC ............... G09G 3/3266; G09G 3/3233; G09G 2300/0819; G09G 2300/0842; G09G 2310/0286; G09G 2310/0291; G09G 2310/08; G09G 2320/043; G09G 2330/021; G09G 2300/0861; G11C 19/28
See application file for complete search history.

(56) References Cited

U.S. PATENT DOCUMENTS 11,776,470 B2 * 10/2023 Xu .................... G11C 19/28
                                                    345/204
11,875,748 B2 *  1/2024 Shang ................. G09G 3/3266
(Continued)

FOREIGN PATENT DOCUMENTS

KR    10-2013-0082094 A    7/2013
KR       10-1951940 B1    2/2019
(Continued)

OTHER PUBLICATIONS

Office Action issued Jan. 26, 2024 for Korean Patent Application No. 10-2021-0170668 (with English Translation).

*Primary Examiner* — Jeff Piziali
(74) *Attorney, Agent, or Firm* — Morgan, Lewis & Bockius LLP

(57) ABSTRACT

Provided are a gate driving circuit and a display device including the same. The gate driving circuit includes a first controller configured to control a first control node to act as a pull-up control node to turn on a first transistor when an activation clock is input to the first controller for a first unit time, and to be deactivated when a deactivation clock is input thereto for a second unit time; and a second controller configured to control a second control node to act as a pull-up control node to turn on a second transistor when the activation clock is input to the second controller for the second unit time, and to be deactivated when the deactivation clock is input thereto for the first unit time.

20 Claims, 18 Drawing Sheets

(52) U.S. Cl.
CPC ............ *G09G 2300/0842* (2013.01); *G09G 2310/0286* (2013.01); *G09G 2310/0291* (2013.01); *G09G 2310/08* (2013.01); *G09G 2320/043* (2013.01); *G09G 2330/021* (2013.01)

(56) References Cited

U.S. PATENT DOCUMENTS

| | | |
|---|---|---|
| 2011/0285675 A1 | 11/2011 | Amano et al. |
| 2013/0077736 A1* | 3/2013 | Son ................. G09G 3/2085 377/64 |
| 2014/0085285 A1 | 3/2014 | Kim |
| 2015/0077407 A1* | 3/2015 | Kim ................. G09G 3/3611 345/204 |
| 2015/0287376 A1* | 10/2015 | Lim ................. G09G 3/3677 345/92 |
| 2018/0130435 A1* | 5/2018 | Lee ................. G09G 3/3677 |
| 2018/0174544 A1 | 6/2018 | Kimura et al. |
| 2018/0234090 A1 | 8/2018 | Miyake et al. |
| 2020/0118509 A1* | 4/2020 | Noh ................. G11C 19/28 |
| 2021/0104197 A1* | 4/2021 | Choi ................. G11C 19/184 |

FOREIGN PATENT DOCUMENTS

| | | |
|---|---|---|
| KR | 10-2019-0100137 A | 8/2019 |
| KR | 10-2020-0034695 A | 3/2020 |

\* cited by examiner

GATE DRIVING CIRCUIT AND DISPLAY DEVICE INCLUDING THE SAME

CROSS-REFERENCE TO RELATED APPLICATION

This application claims priority to and the benefit of Korean Patent Application No. 2021-0089994, filed on Jul. 8, 2021 and Korean Patent Application No. 2021-0170668, filed on Dec. 2, 2021, the disclosure of which is incorporated herein by reference in its entirety.

BACKGROUND

1. Technical Field

The present disclosure relates to a gate driving circuit and a display device including the same.

2. Discussion of the Related Art

Electroluminescence display devices may be divided into inorganic light-emitting display devices and organic light-emitting display devices according to a material of an emission layer. An active matrix organic light-emitting display device includes an organic light-emitting diode (OLED) that generates light by itself and has advantages in terms of a high response rate, high luminous efficiency, high brightness, and a large viewing angle. In an organic light-emitting display device, an OLED is formed at each pixel. The organic light-emitting display device has a high response rate, high luminous efficiency, high brightness, and a large viewing angle and is capable of expressing black gradation in perfect black, thereby achieving a high contrast ratio and a high color reproduction rate.

A pixel circuit of a field-emission display device includes a light-emitting element, a driving element for driving the light-emitting element, and one or more switch elements. The switch elements are turned on or off according to a gate voltage to connect or disconnect main nodes of the pixel circuit. The driving element and the switch elements may be embodied together as a transistor.

The gate driving circuit generates pulses of a gate signal to be applied to gate electrode of the switch elements to control the switch elements. The gate driving circuit include a plurality of transistors. Deterioration of the transistors accelerates due to gate bias stress as a driving time increases. In the gate driving circuit, higher stress is applied to a buffer transistor, because a relatively higher voltage is applied thereto and a drive time is longer than that of other transistors. This is a major factor that reduces the reliability of the gate driving circuit.

SUMMARY

Accordingly, embodiments of the present disclosure are directed to a gate driving circuit and a display device including the same that substantially obviate one or more of the problems due to limitations and disadvantages of the related art.

An aspect of the present disclosure is to provide a gate driving circuit capable of reducing stress applied to a buffer transistor and a display device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a gate driving circuit comprises a plurality of signal transmitters to which a start signal and a shift clock are input and which are configured to charge or discharge a first control node and a second control node, and first buffers each connected to one of the plurality of signal transmitters.

Each of the first buffers includes a first transistor configured to be driven by a voltage of the first control node; and a second transistor configured to be driven by a voltage of the second control node, and connected to the first transistor with a first output node, for outputting a gate pulse, between the first and second transistors.

The plurality of signal transmitters may include a first controller configured to control the first control node to act as a pull-up control node to turn on the first transistor when an activation clock is input to the first controller for a first unit time, and to be deactivated when a deactivation clock is input thereto for a second unit time; and a second controller configured to control the second control node to act as the pull-up control node to turn on the second transistor when the activation clock is input to the second controller for the second unit time, and to be deactivated when the deactivation clock is input thereto for the first unit time.

In another aspect, a gate driving circuit comprises a plurality of signal transmitters configured to charge or discharge a first pull-up control node, a second pull-up control node, and a pull-down control node, wherein a start signal and a shift clock are input to the plurality of signal transmitters; and first buffers each connected to one of the plurality of signal transmitters.

Each of the first buffers of the gate driving circuit may include a 1-1 pull-up transistor configured to be driven by a voltage of a first pull-up control node; a 1-2 pull-up transistor configured to be driven by a voltage of a second pull-up control node; and a first pull-down transistor configured to be driven by a voltage of a pull-down control node.

The plurality of signal transmitters may include a first Q generation logic unit configured to charge the first pull-up control node to turn on the 1-1 pull-up transistor when an activation clock is input to the first Q generation logic unit for a first pull-up time, and to be deactivated when a deactivation clock is input to the first Q generation logic unit for a second pull-up time; a second Q generation logic unit configured to charge the second pull-up control node to turn on the 1-2 pull-up transistor when the activation clock is input to the second Q generation logic unit for the second pull-up time, and to be deactivated when the deactivation clock is input to the second Q generation logic unit for the first pull-up time; and a QB generation logic unit configured to charge the pull-down control node to turn on the first pull-down transistor for a pull-down time during which the first and second pull-up control nodes are discharged.

In another aspect, a display device comprises: a display panel on which a plurality of data lines to which a data voltage is applied, a plurality of gate lines which cross the plurality of data lines and to which a gate signal is applied, and pixels connected to a plurality of power lines are disposed; a data driving circuit configured to receive pixel data and output the data voltage; and a gate driving circuit configured to output the gate signal using a shift register, wherein the shift register of the gate driving circuit comprises: a plurality of signal transmitters configured to charge or discharge a first control node and a second control node, wherein a start signal and a shift clock are input to the plurality of signal transmitters; and buffers each connected to one of the plurality of signal transmitters, wherein each of the buffers comprises: a first transistor configured to be driven by a voltage of the first control node; and a second transistor configured to be driven by a voltage of the second control node, and connected to the first transistor with a first output node between the first and second transistors, and the plurality of signal transmitters comprise: a first controller configured to control the first control node to act as a pull-up control node to turn on the first transistor when an activation clock is input to the first controller for a first unit time, and to be deactivated when a deactivation clock is input to the first controller for a second unit time; and a second controller configured to control the second control node to act as the pull-up control node to turn on the second transistor when the activation clock is input to the second controller for the second unit time, and to be deactivated when the deactivation clock is input to the second controller for the first unit time.

In another aspect, a display device comprises: a display panel on which a plurality of data lines to which a data voltage is applied, a plurality of gate lines which cross the plurality of data lines and to which a gate signal is applied, and pixels connected to a plurality of power lines are disposed; a data driving circuit configured to receive pixel data and output the data voltage; and a gate driving circuit configured to output the gate signal using a shift register, wherein the shift register of the gate driving circuit comprises: a plurality of signal transmitters configured to charge or discharge a first pull-up control node, a second pull-up control node, and a pull-down control node, wherein a start signal and a shift clock are input to the plurality of signal transmitters; and first buffers each connected to one of the plurality of signal transmitters, wherein each of the first buffers comprises: a 1-1 pull-up transistor configured to be driven by a voltage of the first pull-up control node; a 1-2 pull-up transistor configured to be driven by a voltage of the second pull-up control node; and a first pull-down transistor configured to be driven by a voltage of the pull-down control node, and the plurality of signal transmitters comprise: a first Q generation logic unit configured to charge the first pull-up control node to turn on the 1-1 pull-up transistor when an activation clock is input to the first Q generation logic unit for a first pull-up time, and to be deactivated when a deactivation clock is input to the first Q generation logic unit for a second pull-up time; a second Q generation logic unit configured to charge the second pull-up control node to turn on the 1-2 pull-up transistor when the activation clock is input to the second Q generation logic unit for the second pull-up time, and to be deactivated when the deactivation clock is input to the second Q generation logic unit for the first pull-up time; and a QB generation logic unit configured to charge the pull-down control node to turn on the first pull-down transistor for a pull-down time during which the first and second pull-up control nodes are discharged.

A display device of the present disclosure may include the gate driving circuit.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
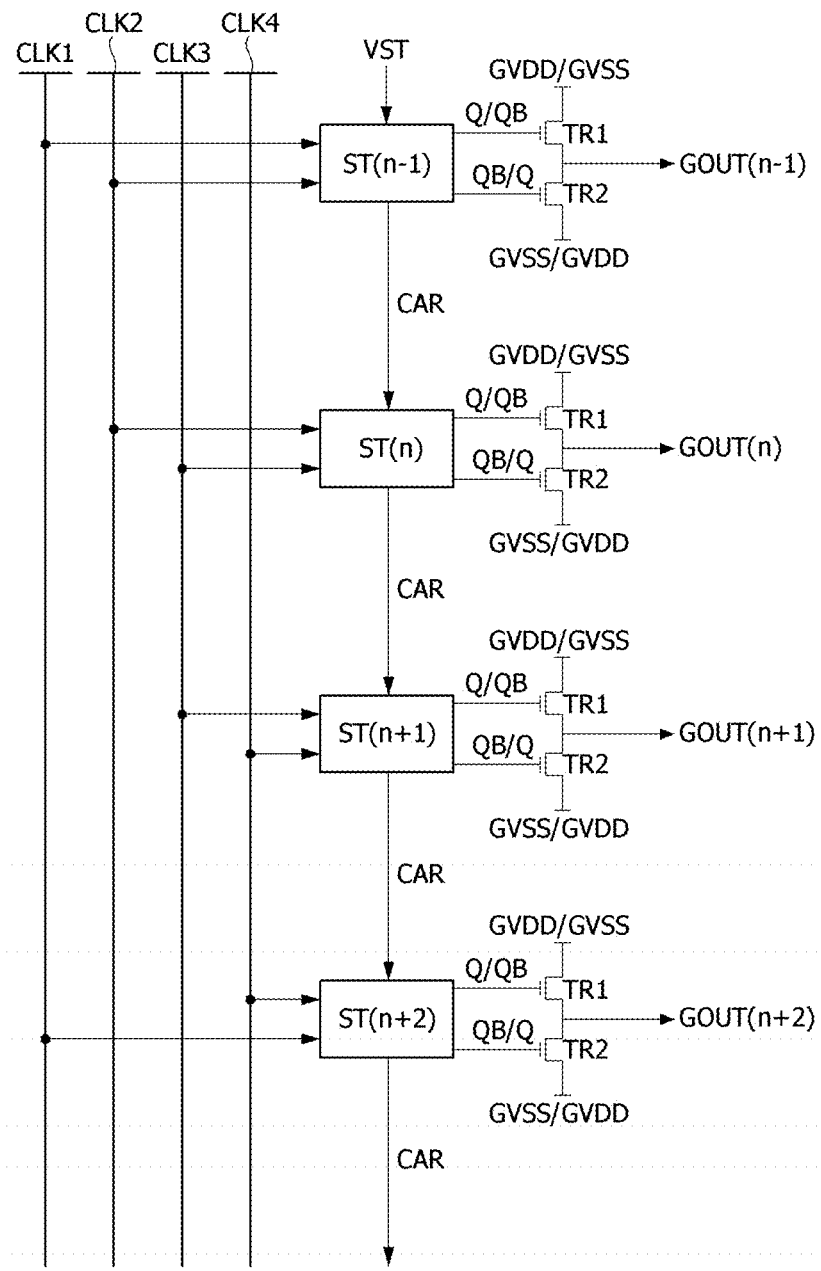
FIG. 1 is a schematic view of a shift register of a gate driving circuit according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," and "having," used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

Each of the pixels may include a plurality of sub-pixels having different colors to in order to reproduce the color of the image on a screen of the display panel. Each of the sub-pixels includes a transistor used as a switch element or a driving element. Such a transistor may be implemented as a TFT (Thin Film Transistor).

A driving circuit of the display device writes a pixel data of an input image to pixels on the display panel. To this end, the driving circuit of the display device may include a data driving circuit configured to supply data signal to the data lines, a gate driving circuit configured to supply a gate signal to the gate lines, and the like.

In a display device of the present disclosure, the pixel circuit and the gate driving circuit may include a plurality of transistors. Transistors may be implemented as oxide thin film transistors (oxide TFTs) including an oxide semiconductor, low temperature polysilicon (LTPS) TFTs including low temperature polysilicon, or the like. In embodiments, descriptions will be given based on an example in which the transistors of the pixel circuit are implemented as the n-channel oxide TFTs, but the present disclosure is not limited thereto.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS), since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage higher than a threshold voltage of a transistor, and the gate-off voltage is set to a voltage lower than the threshold voltage of the transistor. The transistor is turned on in response to the gate-on voltage and is turned off in response to the gate-off voltage. In the case of an n-channel transistor, a gate-on voltage may be a gate high voltage VGH and VEH, and a gate-off voltage may be a gate low voltage VGL and VEH.

Hereinafter, various embodiments of the present disclosure will be described in detail with reference to the accompanying drawings. In the following embodiments, the display device will be mainly described with respect to the organic light emitting display device, but the present invention is not limited thereto.

Figure 2:
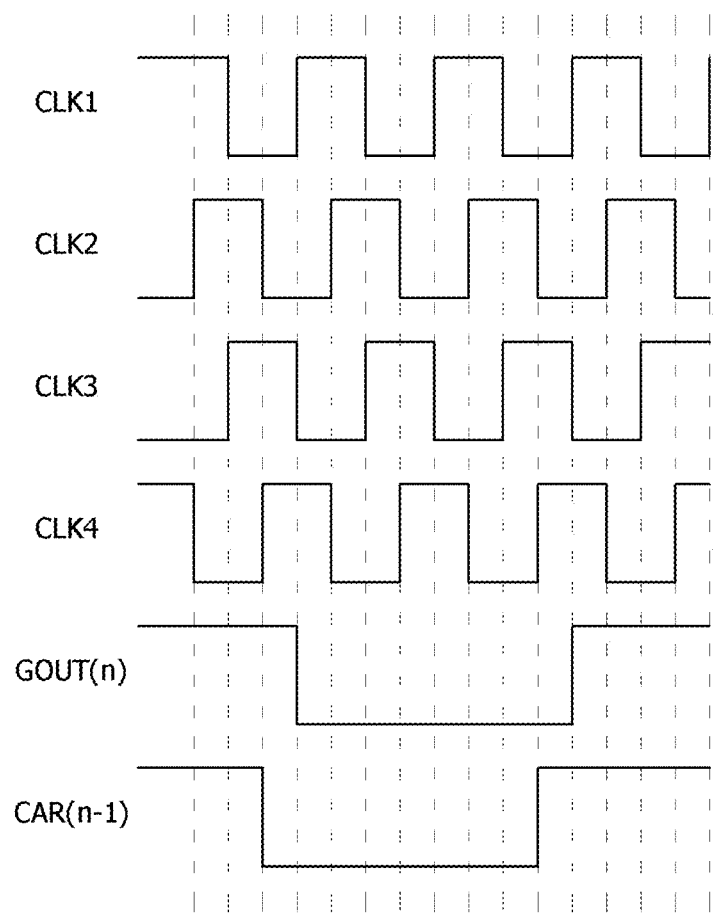
FIG. 2 is a waveform diagram of a shift clock, a gate pulse, and a carry signal input to the shift register of FIG. 1.

Referring to FIGS. 1 and 2, a gate driving circuit includes a shift register that sequentially outputs pulses GOUT(n−1) to GOUT(n+2) of a gate signal (hereinafter referred to as "gate pulses") in synchronization with a shift clock CLK.

The shift register includes signal transmitters ST(n−1) to ST(n+2) that are connected to each other in a dependent manner. Each of the signal transmitters ST(n−1) to ST(n+2) includes a VST node to which a start signal VST is input, a CLK node to which shift clocks CLK1 to CLK4 are input, a first control node and a second control node that alternately drive buffer transistors TR1 and TR2, and the like.

Generally, the start signal VST is input to the first signal transmitter. In FIG. 1, the $(n-1)^{th}$ signal transmitter ST(n−1) may be the first signal transmitter to which the start signal VST is input. The shift clocks CLK1 to CLK4 may be k-phase clocks but are not limited thereto (k is a natural number).

The signal transmitters ST(n) to ST(n+2) connected to the $(n-1)^{th}$ signal transmitter ST(n−1) in a dependent manner are started to be driven when a carry signal CAR is input as a start signal from a preceding signal transmitter. Each of the signal transmitters ST(n−1) to ST(n+2) may output the carry signal CAR through a second output node while outputting gate pulses GOUT(n−1) to GOUT(n+2) through a first output node.

The buffer transistors TR1 and TR2 shown in FIG. 1 output the gate pulse GOUT(n−1) to GOUT(n+2) through the first output node, including the first transistor TR1 and the second transistor TR2 connected to the first output node. The first output node is connected to gate lines of a display panel on which an input image is reproduced.

In at least one of the signal transmitters ST(n−1) to ST(n+2), the first and second transistors TR1 and TR2 are alternately operated as a pull-up transistor at intervals of a predetermined time to supply a gate driving voltage GVDD to the first output node, thereby raising a voltage of the first output node. The first and second transistors TR1 and TR2 may be driven as pull-down transistors at intervals of the predetermined time to discharge the first output node, thereby lowering the gate pulses GOUT(n−1) to GOUT(n+2). The gate driving voltage GVDD may be higher than a gate reference voltage GVSS. The gate driving voltage GVDD may be set as a gate-on voltage, and the gate reference voltage GVSS may be set as a gate-off voltage.

The predetermined time may be a j-frame period (j is a natural number) or a unit time that is set as several seconds [sec].

In at least one of the signal transmitters ST(n−1) to ST(n+2), the first and second transistors TR1 and TR2 alternately operate as a pull-up transistor at intervals of a predetermined time. When one of the first and second transistors TR1 and TR2 operates as a pull-up transistor, the other operates as a pull-down transistor and outputs a gate pulse through the first output node.

Each of the signal transmitters ST(n−1) to ST(n+2) alternately charges or discharges the first control node for control of the first transistor TR1 and the second control node for control of the second transistor TR2 at intervals of a predetermined time.

The first transistor TR1 may be driven as a pull-up transistor for an odd-numbered unit time and be driven as a pull-down transistor for an even-numbered unit time. The second transistor TR2 may be driven as a pull-up transistor for an even-numbered unit time and be driven as a pull-down transistor for an odd-numbered unit time. Hereinafter, a first unit time may be understood as an odd-numbered unit time and a second unit time may be understood as an even-numbered unit time.

Figure 3:
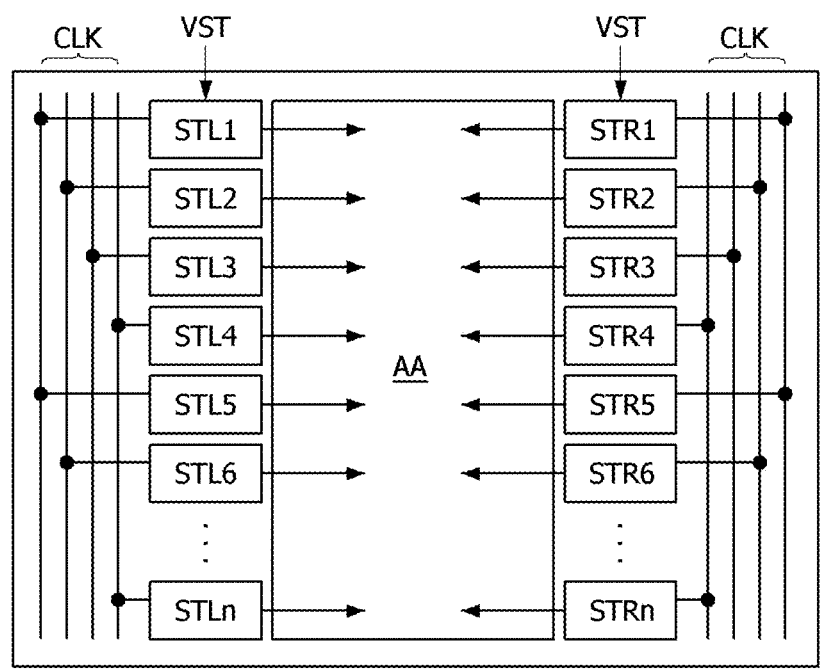
FIG. 3 is a diagram illustrating an example of gate driving circuits disposed on both sides of a display panel.

FIG. 3 is a diagram illustrating an example in which a shift register of a gate driving circuit is mounted on a display panel on which an input image is reproduced. The gate driving circuit may include a first gate driving unit on a left bezel region of the display panel and a second gate driving unit on a right bezel region of the display panel. The first gate driving unit and the second gate driving unit may be disposed on opposite sides of a screen on which an input image is displayed with a pixel array AA between the first and second gate driving units. Each of the first and second gate driving units includes a shift register as shown in FIG. 1. To reduce a bezel region of the display panel, at least some circuit components of the first and second gate driving units may be disposed on the pixel array AA.

Gate pulses GOUT(n−1) to GOUT(n+2) that are output sequentially through the shift register of the gate driving circuit may include scan pulses (or scanning pulses) and emission control pulses (hereinafter referred to as "EM pulses").

In the present disclosure, transistors TR1 and TR2 connected to one signal transmitter may be alternately driven at intervals of a predetermined time to reduce stress on the transistors TR1 and TR2. In another embodiment, according to the present disclosure, a plurality of transistors connected to one signal transmitter are alternately driven to reduce stress thereon.

Figure 4A:
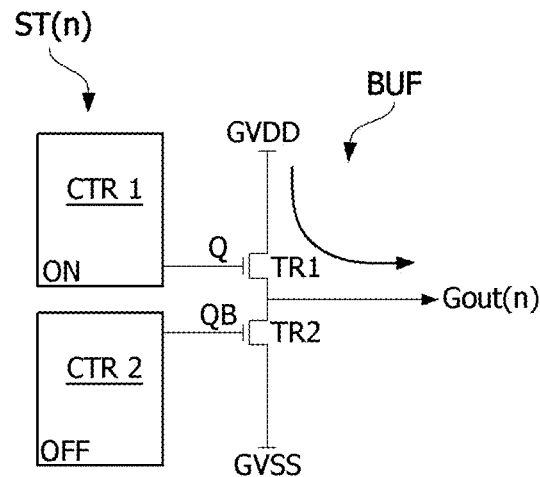
FIGS. 4A and 4B are diagrams illustrating a driving method of a gate driving circuit according to a first embodiment of the present disclosure.
Figure 4B:
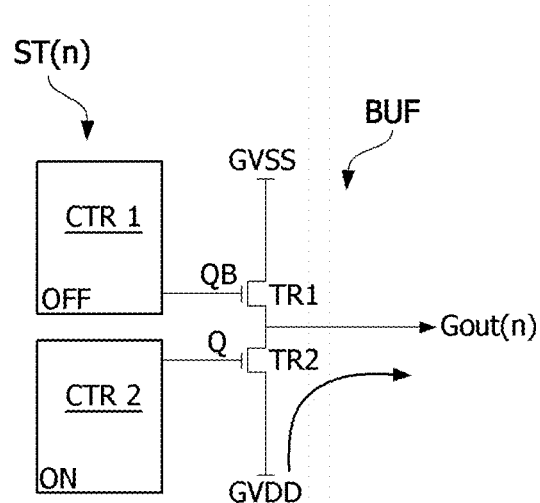

A buffer BUF connected to at least one of signal transmitters ST(n−1) to ST(n+2) may be driven as shown in FIGS. 4A and 4B.

FIGS. 4A and 4B are diagrams illustrating a driving method of first and second buffer transistors TR1 and TR2 according to a first embodiment of the present disclosure.

The first transistor TR1 is driven as a pull-up transistor for a first unit time and driven as a pull-down transistor for a second unit time. As shown in FIG. 4A, the first transistor TR1 operates as a first pull-up transistor in response to a voltage of a first control node Q/QB controlled to act as a pull-up control node Q(n) for a first unit time. In this case, a gate driving voltage GVDD is applied to a first power node and a gate reference voltage GVSS is applied to a second power node. A second control node QB/Q is controlled to act as a pull-down control node QB(n) for the first unit time to operate the second transistor TR2 as a pull-down transistor.

The second transistor TR2 and the first transistor TR1 are alternately driven. For example, the second transistor TR2 operates as a pull-down transistor according to the second control node QB/Q controlled to act as the pull-down control node QB(n) for the first unit time, and thereafter operates as a pull-up transistor in response to a voltage of the second control node QB/Q controlled to act as the pull-up control node Q(n) for the second unit time. Thus, the first and second transistors TR1 and TR2 are alternately driven as a pull-up transistor at intervals of a predetermined time to disperse stress.

As shown in FIG. 4B, the second transistor TR2 operates as a second pull-up transistor for the second unit time during which the second control node QB/Q is controlled to act as the pull-up control node Q(n). In this case, the gate driving voltage GVDD is applied to the second power node and the gate reference voltage GVSS is applied to the first power node. For the second unit time during which the second control node QB/Q is controlled to act as the pull-up control node Q(n), the first control node Q/QB is controlled to act as the pull-down control node QB(n) to operate the first transistor TR1 as a pull-down transistor.

A signal transmitter ST(n) includes a first controller CTR1 for controlling a voltage of the first control node Q/QB and a second controller CTR2 for controlling a voltage of the second control node QB/Q. The first controller CTR1 charges the first control node Q/QB for the first unit time during which an activation clock is input to control the first transistor TR1 as a pull-up transistor (ON state), and is deactivated for the second unit time during which a deactivation clock is input (OFF state). The second controller CTR2 charges the second control node QB/Q for the second unit time during which an activation clock is input to control the second transistor TR2 as a pull-up transistor, and is deactivated for the first unit time during which a deactivation clock is input. In FIG. 1, one of two shift clocks input to a signal transmitter may be an activation clock and the other may be a deactivation clock.

The activation clock includes a plurality of pulses swinging between a high voltage and a low voltage during a unit time. The deactivation clock may be maintained at a low voltage during the unit time. A pulse voltage, i.e., a high voltage, of the activation clock may be set to a gate-on voltage. The low voltage may be set to a gate-off voltage.

The first transistor TR1 operates as a pull-up transistor for the first unit time during which the first control node Q/QB is controlled to act as the pull-up control node Q(n). During the first unit time, the second control node QB/Q may be controlled to act as the pull-down control node QB(n) by the first controller CTR1. During the first unit time, the second control node QB/Q is maintained at the gate reference voltage GVSS. In this case, the second transistor TR2 operates as a pull-down transistor.

The second transistor TR2 operates as a pull-up transistor for the second unit time during which the second control node QB/Q is controlled to act as the pull-up control node Q(n). During the second unit time, the first control node Q/QB may be controlled to act as the pull-down control node QB(n) by the second controller CTR2. During the second unit time, the first control node Q/QB is maintained at the gate reference voltage GVSS. In this case, the first transistor TR1 operates as a pull-down transistor.

Figure 5:
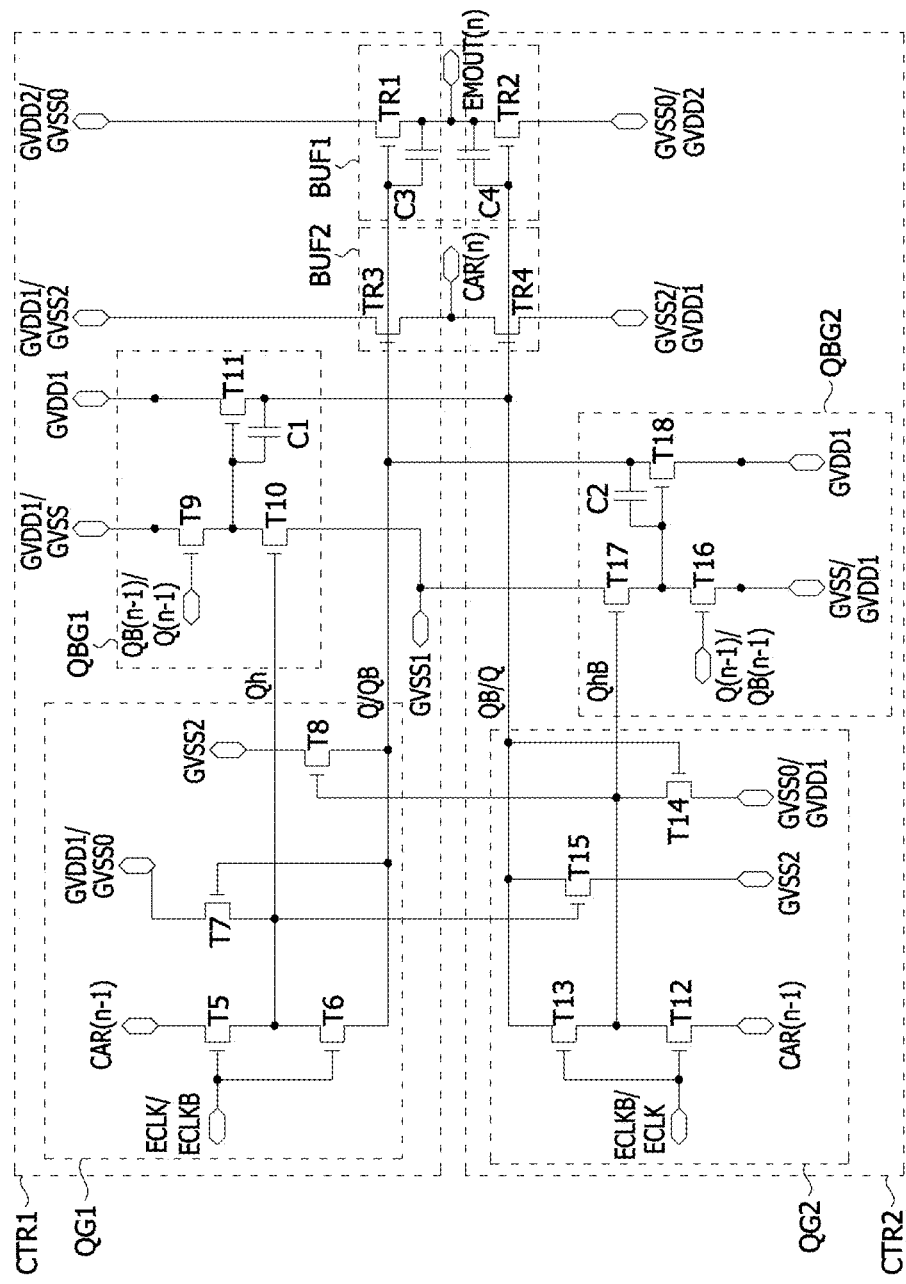
FIG. 5 is a detailed circuit diagram of a signal transmitter and a buffer shown in FIGS. 4A and 4B.

FIG. 5 is a detailed circuit diagram of the signal transmitter ST(n) and the buffer BUF shown in FIGS. 4A and 4B. In an embodiment of FIG. 5, an example of a circuit of the $n^{th}$ signal transmitter ST(n) that outputs an EM pulse and the buffer BUF connected to the $n^{th}$ signal transmitter ST(n) is shown, but the present disclosure is not limited thereto. For example, a scan pulse may be generated using a circuit substantially the same as the circuit of FIG. 5 and using a clock appropriate for a scan pulse as a shift clock. Signal transmitters other than the $n^{th}$ signal transmitter ST(n) may be embodied as circuits substantially the same as the $n^{th}$ signal transmitter ST(n). All transistors constituting a shift register may be embodied as n-channel oxide thin-film transistors (TFTs).

Figure 6A:
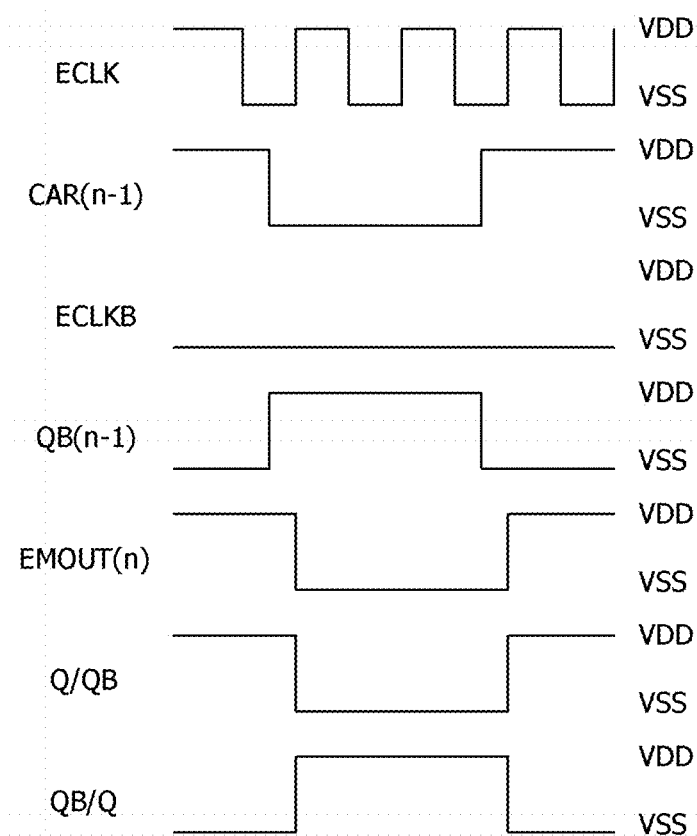
FIGS. 6A and 6B are waveform diagrams of signals input to and output from the circuit of FIG. 5 and voltages of main nodes.
Figure 6B:
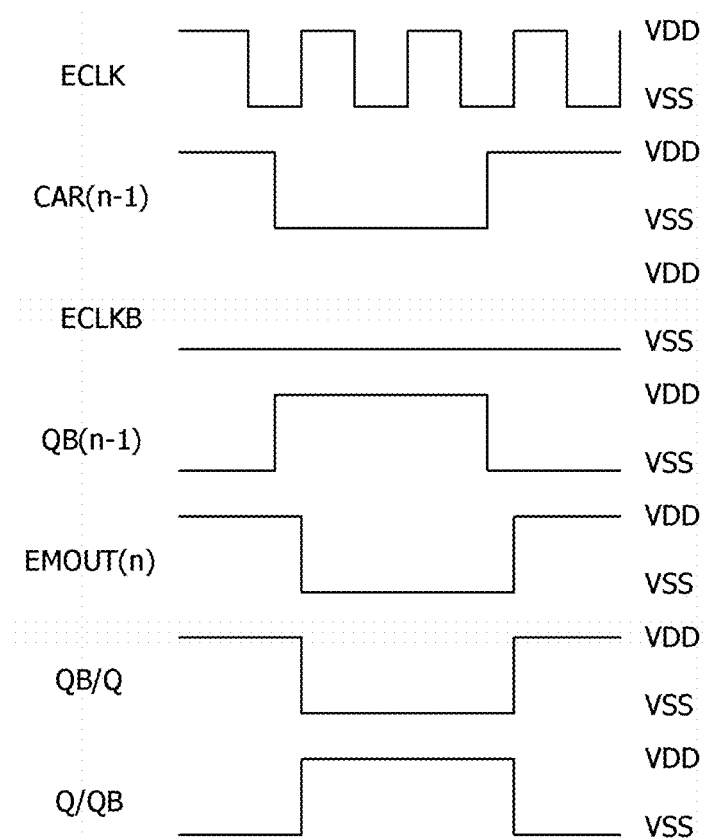
Figure 7A:
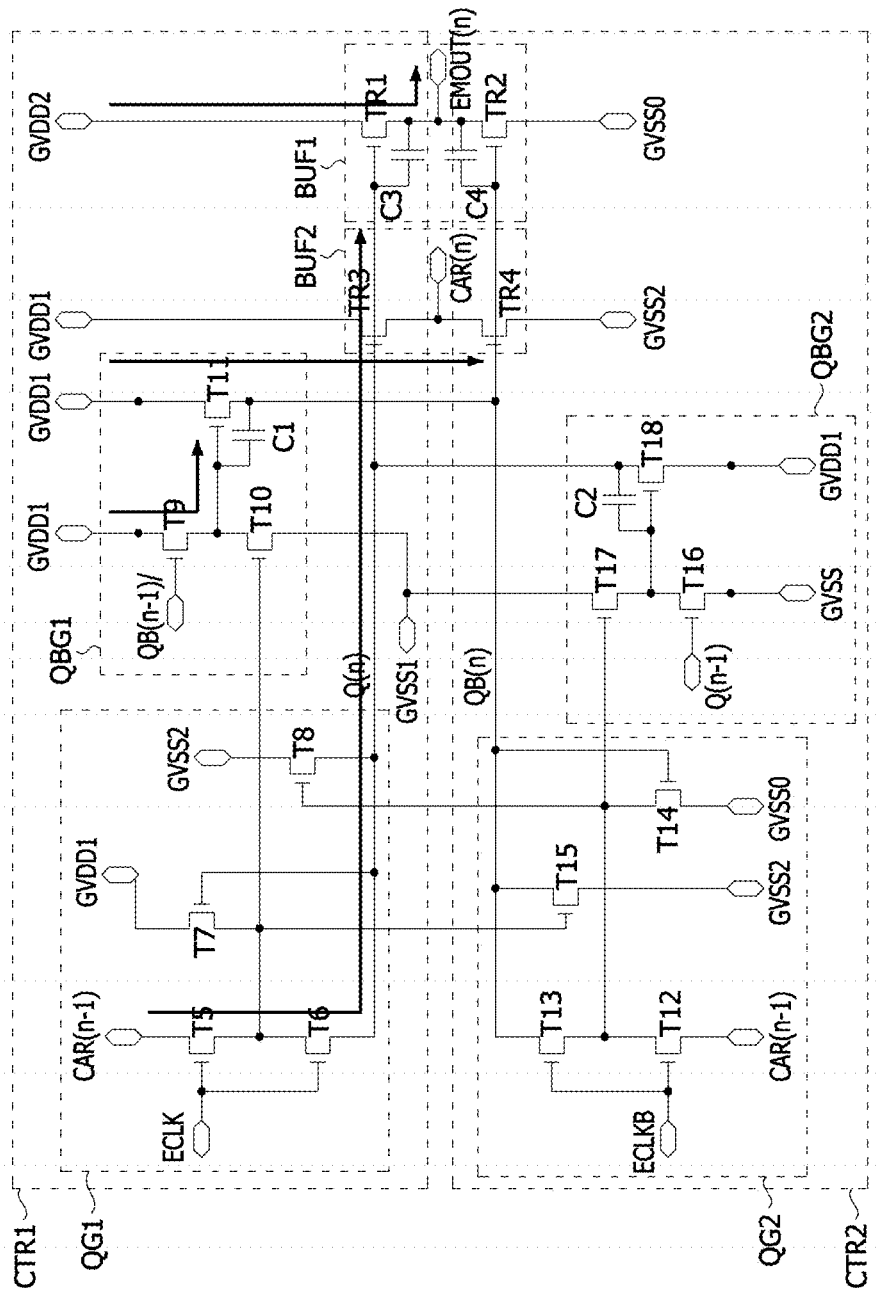
FIGS. 7A and 7B are circuit diagrams illustrating operations of the circuit of FIG. 5 for a first unit time and a second unit time.
Figure 7B:
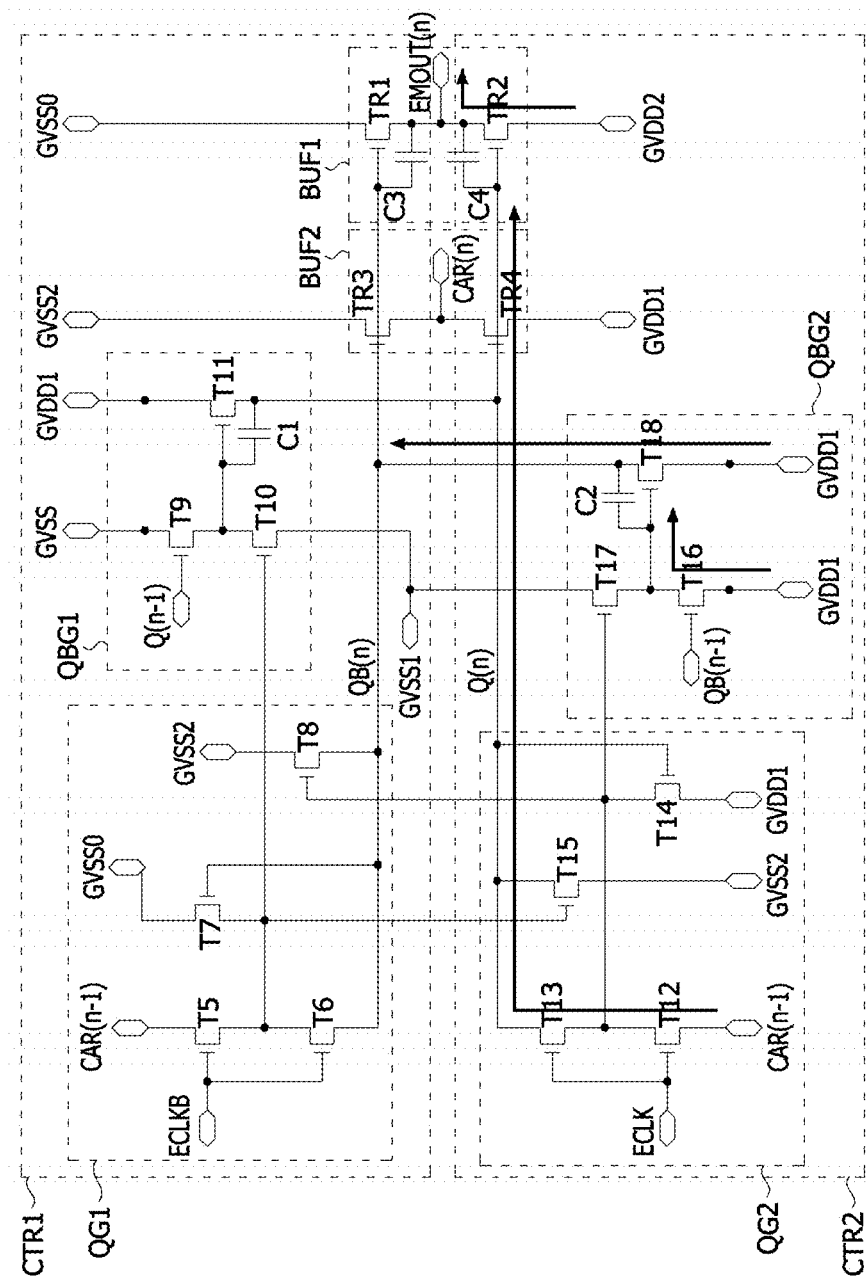

FIGS. 6A and 6B are waveform diagrams of signals input to and output from the circuit of FIG. 5 and voltages of main nodes. FIG. 6A illustrates first and second control node voltages charged or discharged by the first controller CTR1 activated for a first unit time. FIG. 6B illustrates first and second control node voltages charged or discharged by the second controller CTR2 activated for a second unit time. In FIGS. 6A and 6B, 'VDD' denotes a high voltage and 'VSS' denotes a low voltage. FIGS. 7A and 7B are circuit diagrams illustrating operations of the circuit of FIG. 5 for a first unit time and a second unit time. FIG. 7A illustrates a flow of current when the first control node Q/QB is controlled to act as the pull-up control node Q(n) and the second control node QB/Q is controlled to act as the pull-down control node QB(n) by the first controller CTR1 activated for the first unit time. FIG. 7B illustrates a flow of current when the second control node QB/Q is controlled to act as the pull-up control node Q(n) and the first control node Q/QB is controlled to act as the pull-down control node QB(n) by the second controller CTR2 activated for the second unit time.

Referring to FIGS. 5 to 7B, the $n^{th}$ signal transmitter ST(n) includes the first controller CTR1 and the second controller CTR2 and is connected to a first buffer BUF1 and a second buffer BUF2.

In FIG. 5, gate driving voltages GVDD1 and GVDD2 may be set to different voltages, but are not limited thereto. Gate reference voltages GVSS, GVSS0, and GVSS2 may be set to different voltages, but are not limited thereto.

The first buffer BUF1 charges or discharges the first output node according to voltages of the first and second control nodes Q/QB and QB/Q and outputs an EM pulse EMOUT(n). The first buffer BUF1 includes the first and second transistors TR1 and TR2. The first transistor TR1 includes a gate electrode connected to the first control node Q/QB, a first electrode connected to the first power node, and a second electrode connected to the first output node. The second transistor TR2 is connected to the first transistor TR1 with the first output node between the first and second transistors TR1 and TR2. The second transistor TR2 includes a gate electrode connected to the second control node QB/Q, a first electrode connected to the first output node, and a second electrode connected to the second power node. Voltages applied to the first power node and the second power node are switched between the gate driving voltage GVDD2 and the gate reference voltage GVSS0 at intervals of a predetermined time. For example, the gate driving voltage GVDD2 may be applied to the first power node for the first unit time and thereafter the gate reference voltage GVSS0 may be applied thereto for the second unit time. In contrast, the gate reference voltage GVSS0 may be applied to the second power node for the first unit time and thereafter the gate driving voltage GVDD2 may be applied thereto for the second unit time.

A third capacitor C3 may be connected between the gate electrode and the second electrode of the first transistor TR1. A fourth capacitor C4 may be connected between the gate electrode and the first electrode of the second transistor TR2.

The second buffer BUF2 charges or discharges the second output node according to voltages of the first and second control nodes Q/QB and QB/Q and outputs a carry pulse CAR(n). The second buffer BUF2 includes third and fourth transistors TR3 and TR4. The third transistor TR3 includes a gate electrode connected to the first control node Q/QB, a first electrode connected to a third power node, and a second electrode connected to the second output node. The fourth transistor TR4 is connected to the third transistor TR3 with the second output node therebetween. The fourth transistor TR4 includes a gate electrode connected to the second control node QB/Q, a first electrode connected to the second output node, and a second electrode connected to the fourth power node. Voltages applied to the third power node and the fourth power node are switched between the gate driving voltage GVDD1 and the gate reference voltage GVSS2. For example, the gate driving voltage GVDD1 may be applied to the third power node for the first unit time and thereafter the gate reference voltage GVSS2 may be applied thereto for the second unit time. In contrast, the gate reference voltage GVSS2 may be applied to the fourth power node for the first unit time and thereafter the gate driving voltage GVDD1 may be applied thereto for the second unit time.

In at least one of the first buffers BUF1, a power supply voltage applied to the first and second transistors TR1 and TR2 may be periodically switched. In at least one of the second buffers BUF2, the power supply voltage applied to the third and fourth transistors TR3 and TR4 may be periodically switched.

The first controller CTR1 includes a first Q generation logic unit QG1 and a first QB generation logic unit QBG1.

As shown in FIGS. 6A and 7A, the first Q generation logic unit QG1 controls the first control node Q/QB and the second control node QB/Q to act as the pull-up control node Q(n) and the pull-down control node QB(n), respectively, when an activation clock ECLK is input to a first CLK node to charge the first control node Q/QB for the first unit time. The first Q generation logic unit QG1 is deactivated for the second unit time during which a deactivation clock ECLKB is input to the first CLK node.

The first Q generation logic unit QG1 may include fifth to eighth transistors T5 to T8.

The fifth transistor T5 is turned on for the first unit time during which the activation clock ECLK is input to the first CLK node, thereby connecting a carry signal node to a first buffer node Qh. A carry pulse CAR(n–1) is applied to the carry signal node. The carry pulse CAR(n–1) is output from a second output node of a preceding signal transmitter, e.g., the $(n-1)^{th}$ signal transmitter ST(n–1). The fifth transistor T5 includes a gate electrode connected to the first CLK node, a first electrode connected to the carry signal node, and a second electrode connected to the first buffer node Qh. The deactivation clock ECLKB is input to the first CLK node for the second unit time.

The sixth transistor T6 is turned on for the first unit time during which the activation clock ECLK is input to the first CLK node, thereby connecting the first buffer node Qh to the first control node Q/QB. The sixth transistor T6 includes a gate electrode connected to the first CLK node, a first electrode connected to the first buffer node Qh, and a second electrode connected to the first control node Q/QB.

The fifth and sixth transistors T5 and T6 are turned on according to a high voltage VDD of the activation clock ECLK for the first unit time during which the activation clock ECLK is applied to the first CLK node, thereby charging the first buffer node Qh and the first control node Q/QB. In this case, the first control node Q/QB acts as the pull-up control node Q(n). The fifth and sixth transistors T5 and T6 are maintained in the off state for the second unit time during which the deactivation clock ECLKB is input to the first CLK node.

When the first control node Q/QB is charged with the high voltage VDD, the seventh transistor T7 is turned on to connect a fifth power node to the first buffer node Qh, thereby charging or discharging the first buffer node Qh. The gate driving voltage GVDD1 is applied to the fifth power node for the first unit time as shown in FIG. 7A and the gate reference voltage GVSS0 is applied thereto for the second unit time as shown in FIG. 7B. The seventh transistor T7 includes a gate electrode connected to the first control node Q/QB, a first electrode connected to the fifth power node, and a second electrode connected to the first buffer node Qh.

When a voltage of a second buffer node QhB is the high voltage VDD, the eighth transistor T8 is turned on to connect a sixth power node to the first control node Q/QB, thereby discharging the first control node Q/QB. The gate reference voltage GVSS2 is applied to the sixth power node. The eighth transistor T8 includes a gate electrode connected to the second buffer node QhB, a first electrode connected to the sixth power node, and a second electrode connected to the first control node Q/QB.

As shown in FIGS. 6A and 7A, the first QB generation logic unit QBG1 charges the second control node QB/Q to control the second control node QB/Q to act as the pull-down control node QB(n) when the first control node Q/QB is discharged to a low voltage VSS for the first unit time.

The first QB generation logic unit QBG1 may include ninth to eleventh transistors T9, T10, and T11.

The ninth transistor T9 is turned on to connect a seventh power node to a gate electrode of the eleventh transistor T11 when a voltage of the second control node QB/Q of a preceding signal transmitter, e.g., the $(n-1)^{th}$ signal transmitter ST(n−1), is a high voltage VDD. The gate driving voltage GVDD1 is applied to the seventh power node for the first unit time as shown in FIG. 7A and the gate reference voltage GVSS is applied thereto for the second unit time as shown in FIG. 7B. The ninth transistor T9 includes a gate electrode connected to a second control node QB/Q of a preceding signal transmitter, a first electrode connected to the seventh power node, and a second electrode connected to the gate electrode of the eleventh transistor T11.

The tenth transistor T10 is turned on to connect the gate electrode of the eleventh transistor T11 to a tenth power node when a voltage of the first buffer node Qh is a high voltage VDD. The gate reference voltage GVSS1 is applied to the tenth power node. The tenth transistor T10 includes a gate electrode connected to the first buffer node Qh, a first electrode connected to the gate electrode of the eleventh transistor T11, and a second electrode connected to the tenth power node.

The eleventh transistor T11 is turned on to connect an eleventh power node to the second control node QB/Q when a gate voltage is the high voltage VDD. The gate driving voltage GVDD1 is applied to the eleventh power node. The eleventh transistor T11 includes a gate electrode connected to the second electrode of the ninth transistor T9 and the first electrode of the tenth transistor T10, a first electrode connected to the eleventh power node, and a second electrode connected to the second control node QB/Q. A first capacitor C1 may be connected between the gate electrode and the second electrode of the eleventh transistor T11.

The second controller CTR2 includes a second Q generation logic unit QG2 and a second QB generation logic unit QBG2.

As shown in FIGS. 6B and 7B, the second Q generation logic unit QG2 controls the second control node QB/Q and the first control node Q/QB to act as the pull-up control node Q(n) and the pull-down control node QB(n), respectively, when the second control node QB/Q is charged for the second unit time during which the activation clock ECLK is input to a second CLK node. The second Q generation logic unit QG2 is deactivated for the second unit time during which the deactivation clock ECLKB is input to the second CLK node.

The second Q generation logic unit QG2 may include twelfth to fifteenth transistors T12 to T15.

The twelfth transistor T12 is turned on for the second unit time during which the activation clock ECLK is input to the second CLK node, thereby connecting the carry signal node to the second buffer node QhB. A carry pulse CAR(n−1) is applied to the carry signal node. The carry pulse CAR(n−1) is output from a second output node of a preceding signal transmitter, e.g., the $(n-1)^{th}$ signal transmitter ST(n−1). The twelfth transistor T12 includes a gate electrode connected to the second CLK node, a first electrode connected to the carry signal node, and a second electrode connected to the second buffer node QhB.

The thirteenth transistor T13 is turned on for the second unit time during which the activation clock ECLK is input to the second CLK node, thereby connecting the second buffer node QhB to the second control node QB/Q. The thirteenth transistor T13 includes a gate electrode connected to the second CLK node, a first electrode connected to the second buffer node QhB, and a second electrode connected to the second control node QB/Q.

The twelfth and thirteenth transistors T12 and T13 are turned on according to the high voltage VDD of the activation clock ECLK for the second unit time during which the activation clock ECLK is applied to the second CLK node, thereby charging the second buffer node QhB and the second control node QB/Q. In this case, the second control node QB/Q acts as the pull-up control node Q(n). The twelfth and thirteenth transistors T12 and T13 are maintained in the off state for the first unit time during which the deactivation clock ECLKB is input to the second CLK node.

When the second control node QB/Q is charged with the high voltage VDD, the fourteenth transistor T14 is turned on to connect a twelfth power node to the second buffer node QhB, thereby charging or discharging the second buffer node QhB. The gate driving voltage GVDD1 is applied to the twelfth power node for the second unit time as shown in FIG. 7B and the gate reference voltage GVSS0 is applied thereto for the first unit time as shown in FIG. 7A. The fourteenth transistor T14 includes a gate electrode connected to the second control node QB/Q, a first electrode connected to the twelfth power node, and a second electrode connected to the second buffer node QhB.

When a voltage of the first buffer node Qh is the high voltage VDD, the fifteenth transistor T15 is turned on to connect the sixth power node to the second control node QB/Q, thereby discharging the second control node QB/Q. The gate reference voltage GVSS2 is applied to the sixth power node. The fifteenth transistor T15 includes a gate electrode connected to the first buffer node Qh, a first electrode connected to the sixth power node, and a second electrode connected to the second control node QB/Q.

As shown in FIGS. 6B and 7B, the second QB generation logic unit QBG2 charges the first control node Q/QB to control the first control node Q/QB to act as the pull-down control node QB(n) when the second control node QB/Q is discharged to the low voltage VSS for the second unit time.

The second QB generation logic unit QBG2 may include sixteenth to eighteenth transistors T16, T17, and T18.

The sixteenth transistor T16 is turned on to connect a thirteenth power node to a gate electrode of the eighteenth transistor T18 when a voltage of the first control node Q/QB of a preceding signal transmitter, e.g., the $(n-1)^{th}$ signal transmitter ST(n−1), is the high voltage VDD. The gate reference voltage GVSS is applied to the thirteenth power node for the first unit time as shown in FIG. 7A, and the gate driving voltage GVDD1 is applied thereto for the second unit time as shown in FIG. 7B. The sixteenth transistor T16 includes a gate electrode connected to a first control node Q/QB of a preceding signal transmitter, a first electrode connected to the thirteenth power node, and a second electrode connected to the gate electrode of the eighteenth transistor T18.

The seventeenth transistor T17 is turned on to connect the gate electrode of the eighteenth transistor T18 to the tenth power node when a voltage of the second buffer node QhB is the high voltage VDD. The gate reference voltage GVSS1 is applied to the tenth power node. The seventeenth transistor T17 includes a gate electrode connected to the second buffer node QhB, a first electrode connected to the gate electrode of the eighteenth transistor T18, and a second electrode connected to the tenth power node.

The eighteenth transistor T18 is turned on to connect the eleventh power node to the first control node Q/QB when a gate voltage is the high voltage VDD. The gate driving voltage GVDD1 is applied to the eleventh power node. The eighteenth transistor T18 includes the gate electrode connected to the second electrode of the sixteenth transistor T16 and the first electrode of the seventeenth transistor T17, a first electrode connected to the eleventh power node, and a second electrode connected to the first control node Q/QB. A second capacitor C2 may be connected between the gate electrode and the second electrode of the eighteenth transistor T18.

Figure 8A:
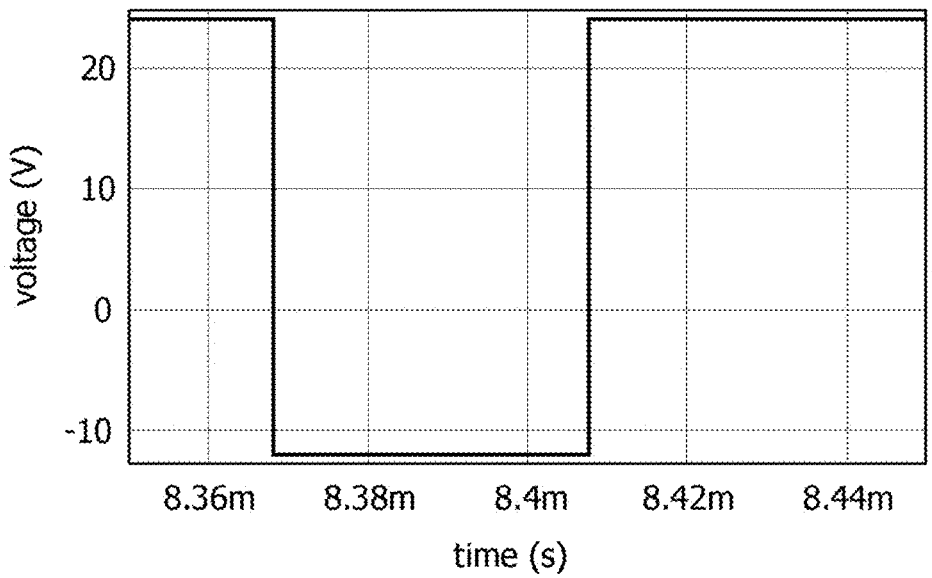
FIGS. 8A to 8F illustrate waveforms according to a simulation conducted by inputting the signals of FIGS. 6A and 6B to the circuit of FIG. 5.
Figure 8B:
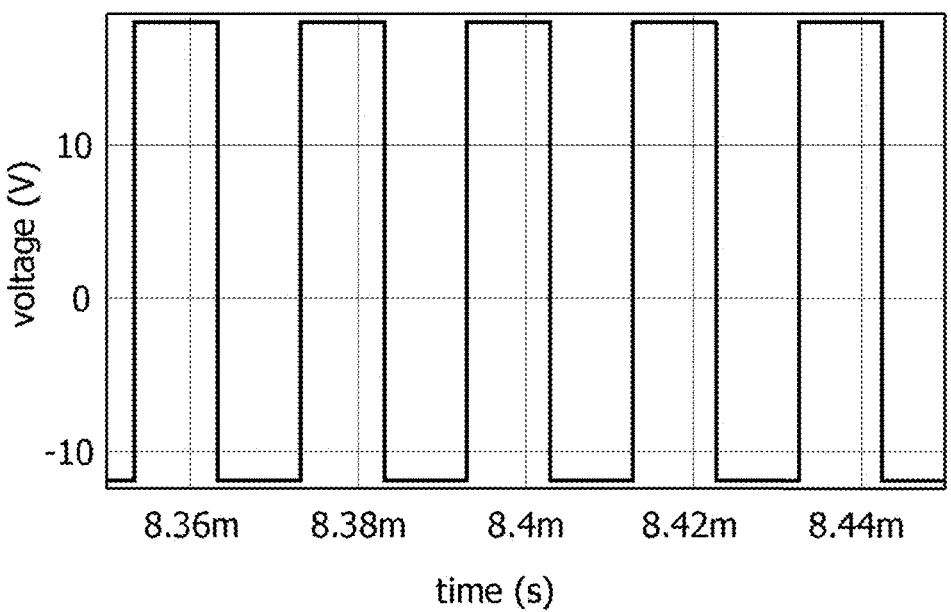
Figure 8C:
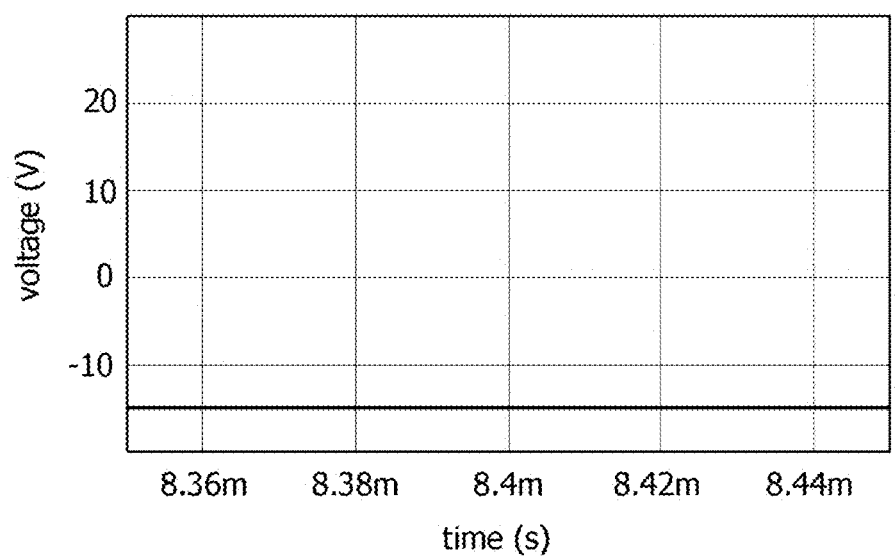
Figure 8D:
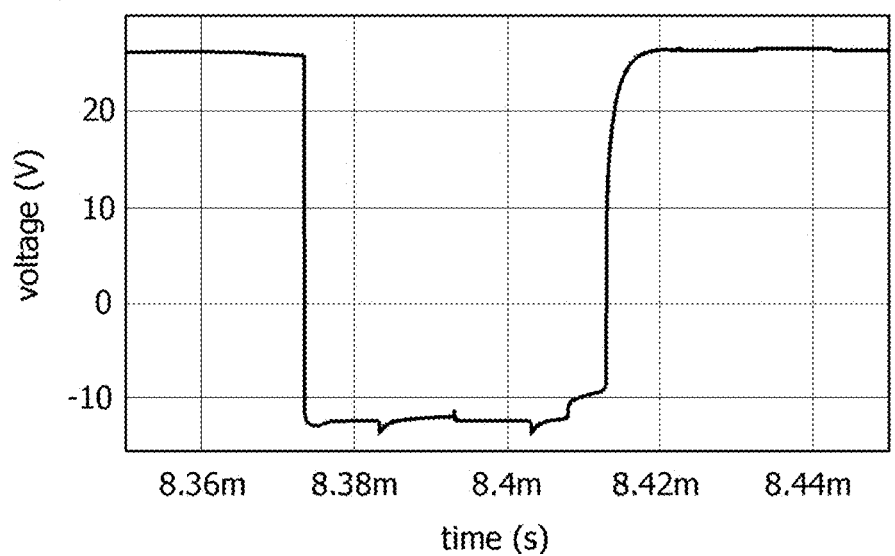
Figure 8E:
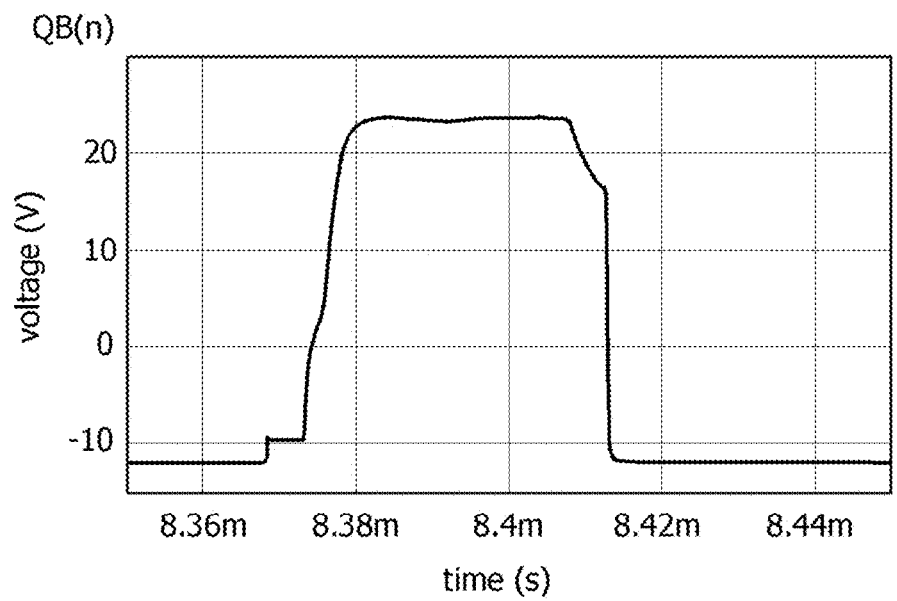
Figure 8F:
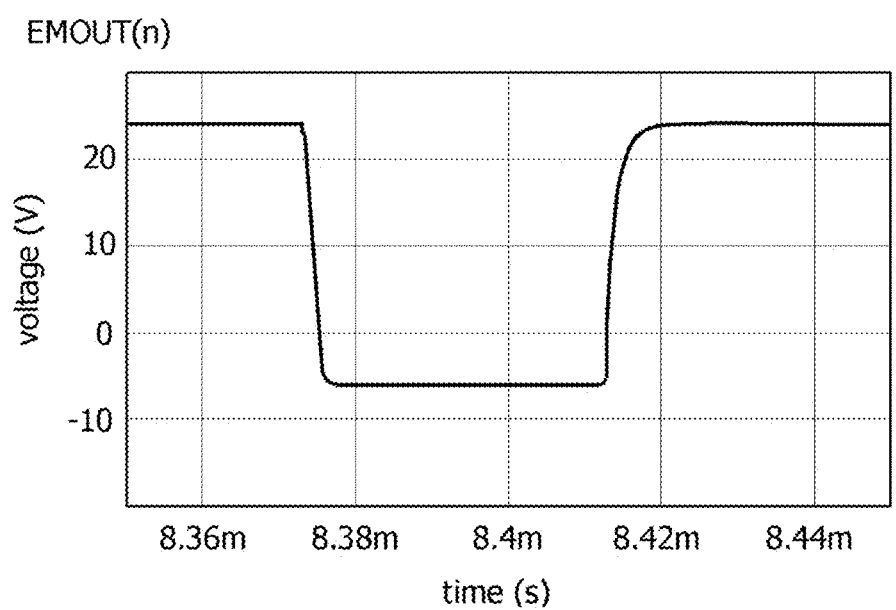

FIGS. 8A to 8F illustrate waveforms according to a simulation conducted by inputting the signals of FIGS. 6A and 6B to the circuit of FIG. 5. In FIG. 8D, 'Q(n)' denotes a waveform of a pull-up control node corresponding to a voltage of a first control node Q/QB for a first unit time and a voltage of a second control node QB/Q for a second unit time. In FIG. 8E, 'QB(n)' denotes a waveform of a pull-down control node corresponding to a voltage of the second control node QB/Q for the first unit time and a voltage of the first control node Q/QB for the second unit time.

In a gate driving circuit of another embodiment, two pull-up transistors are alternately driven to disperse stress thereon as shown in FIGS. 9A to 10B. This embodiment is applicable to at least one of first and second Q generation logic units as described above and a buffer connected to the at least one Q generation logic unit or is applicable alone. For example, in the present disclosure, a Q generation logic unit of at least one of at least the first and second controllers CTR1 and CTR2 of the gate driving circuit shown in FIGS. 4A to 5 may be configured as the first and second Q generation logic units shown in FIGS. 10A and 10B. In this case, each buffer transistor may include two transistors that are alternately driven. The first unit time may be divided into first and second pull-up times, the first Q generation logic unit may drive one of the two pull-up transistors for the first pull-up time, and the second Q generation logic unit may drive the other pull-up transistor for the second pull-up time.

Figure 9A:
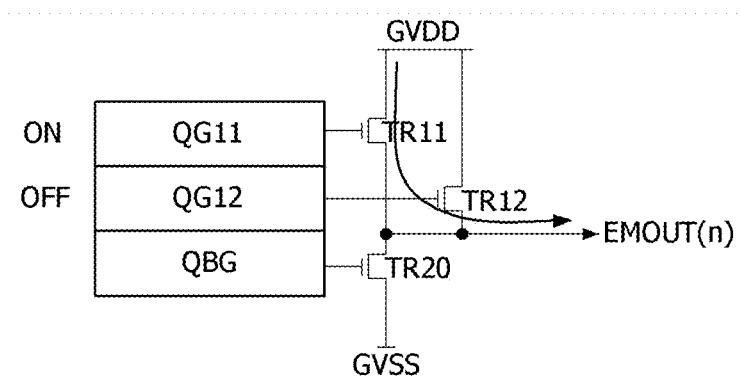
FIGS. 9A and 9B are diagrams illustrating a driving method of a gate driving circuit according to a second embodiment of the present disclosure.
Figure 9B:
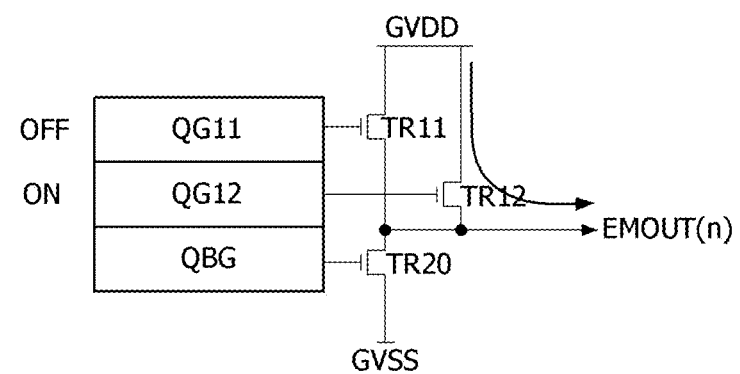
Figure 10A:
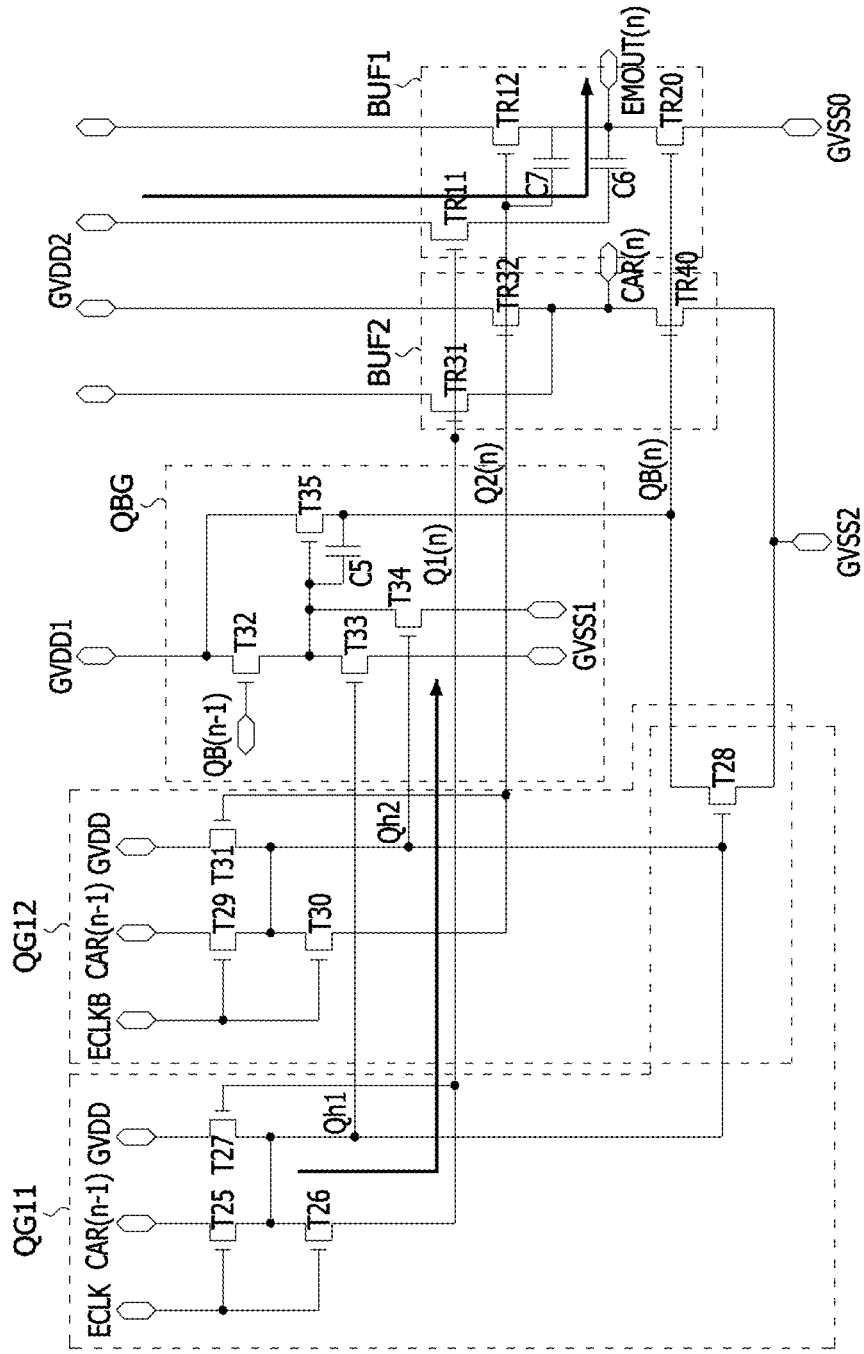
FIGS. 10A and 10B are circuit diagrams illustrating operations of the circuit shown in FIGS. 9A and 9B for a first pull-up time and a second pull-up time.
Figure 10B:
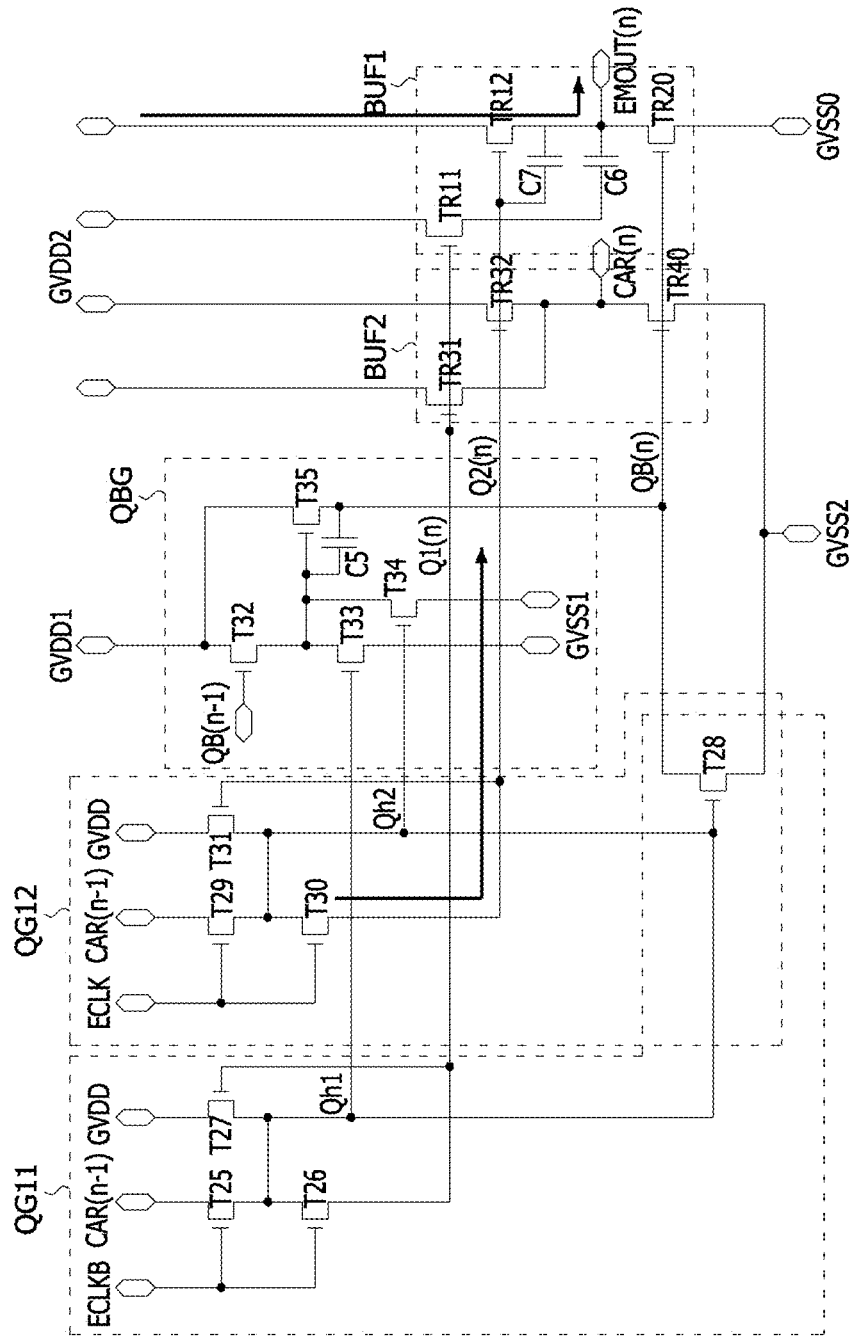

FIGS. 9A and 9B are diagrams illustrating a driving method of buffer transistors according to a second embodiment of the present disclosure. In FIGS. 9 and 10, gate driving voltages GVDD, GVDD1 and GVDD2 may be set to different voltages, but are not limited thereto. Gate reference voltages GVSS0, GVSS1, and GVSS2 may be set to different voltages, but are not limited thereto. FIGS. 10A and 10B are circuit diagrams illustrating operations of the circuit shown in FIGS. 9A and 9B for a first pull-up time and a second pull-up time.

Referring to FIGS. 9A to 10B, an $n^{th}$ signal transmitter ST(n) includes a first Q generation logic unit QG11, a second Q generation logic unit QG12, and a QB generation logic unit QBG.

The first Q generation logic unit QG11 drives a 1-1 pull-up transistor TR11 of a first buffer BUF1 by charging a first pull-up control node Q1(n) for the first pull-up time during which an activate clock ECLK is input (ON state). The first Q generation logic unit QG11 may further drive a 3-1 pull-up transistor TR31 of a second buffer BUF2 for the first pull-up time as illustrated in FIG. 10A. The first Q generation logic unit QG11 may be deactivated for the second pull-up time by inputting a deactivation clock ECLKB thereto (OFF state) as shown in FIG. 10B.

The second Q generation logic unit QG12 and the first Q generation logic unit QG11 are alternately activated to charge a second pull-up control node Q2(n), thereby driving a 1-2 pull-up transistor TR12. The second Q generation logic unit QG12 drives the 1-2 pull-up transistor TR12 of the first buffer BUF1 for the second pull-up time during which the activation clock ECLK is input as shown in FIG. 10A. The second Q generation logic unit QG12 may further drive a 3-2 pull-up transistor TR32 of the second buffer BUF2 for the second pull-up time. The second Q generation logic unit QG12 may be deactivated for the first pull-up time by inputting the deactivation clock ECLKB thereto as shown in FIG. 10B.

The activation clock ECLK includes a plurality of pulses that swing between a high voltage and a low voltage for a unit time. The deactivation clock ECLKB is maintained at a low voltage during a unit time.

The QB generation logic unit QBG drives pull-down transistors TR20 and TR40 by charging a pull-down control node QB(n) for a pull-down time during which the first and second pull-up control nodes Q1(n) and Q2(n) are discharged. The QB generation logic unit QBG may drive the pull-down transistors TR20 and TR40 of the first buffer BUF1 in response to a voltage of a pull-up control node of a preceding signal transmitter, e.g., an $(n-1)^{th}$ signal transmitter ST(n−1).

The first buffer BUF1 charges or discharges a first output node and outputs an EM pulse EMOUT (n). The first buffer BUF1 includes the 1-1 pull-up transistor TR11 and the 1-2 pull-up transistor TR12 that are alternately driven by the first and second Q generation logic units QG11 and QG12, and the first pull-down transistor TR20 driven by the QB generation logic unit QBG.

The 1-1 pull-up transistor TR11 includes a gate electrode connected to the first pull-up control node Q1(n), a first electrode connected to a first power node, and a second electrode connected to the first output node. The 1-2 pull-up transistor TR12 includes a gate electrode connected to the second pull-up control node Q2(n), a first electrode connected to the first power node, and a second electrode connected to the first output node. The gate driving voltage GVDD2 is applied to the first power node. A second capacitor C6 may be connected between the gate electrode and the second electrode of the 1-1 pull-up transistor TR11. A third capacitor C7 may be connected between the gate electrode and the second electrode of the 1-2 pull-up transistor TR12.

The first pull-down transistor TR20 is connected to the 1-1 and 1-2 pull-up transistors TR11 and TR12 with the first output node between the first pull-down transistor TR20 and the 1-1 and 1-2 pull-up transistors TR11 and TR12. The first pull-down transistor TR20 includes a gate electrode connected to the pull-down control node QB(n), a first electrode connected to the first output node, and a second electrode connected to a second power node. The gate reference voltage GVSS0 is applied to the second power node.

The second buffer BUF2 charges or discharges a second output node and outputs a carry pulse CAR(n). The second buffer BUF2 includes the 3-1 pull-up transistor TR31 and the 3-2 pull-up transistor TR32 that are alternately driven by the first and second Q generation logic units QG11 and QG12, and the second pull-down transistor TR40 driven by the QB generation logic unit QBG.

The 3-1 pull-up transistor TR31 includes a gate electrode connected to the first pull-up control node $Q1(n)$, a first electrode connected to the first power node, and a second electrode connected to the second output node. The 3-2 pull-up transistor TR32 includes a gate electrode connected to the second pull-up control node $Q2(n)$, a first electrode connected to the first power node, and a second electrode connected to the second output node.

The second pull-down transistor TR40 is connected to the 3-1 and 3-2 pull-up transistors TR31 and TR32 with the second output node between the second pull-down transistor TR40 and the 3-1 and 3-2 pull-up transistors TR31 and TR32. The second pull-down transistor TR40 includes a gate electrode connected to the pull-down control node QB(n), a first electrode connected to the second output node, and a second electrode connected to the second power node.

The first Q generation logic unit QG11 may include fourth to sixth transistors T25 to T27 as shown in FIGS. 10A and 10B. The first Q generation logic unit QG11 may further include a seventh transistor T28 shared with the second Q-generation logic unit QG12.

The fourth transistor T25 is turned on for the first pull-up time during which the activation clock ECLK is input to the first CLK node, thereby connecting the carry signal node to a first buffer node Qh1. A carry pulse CAR(n−1) from a preceding signal transmitter is applied to the carry signal node. The carry pulse CAR(n−1) may be output from a second output node of a preceding signal transmitter, e.g., the $(n-1)^{th}$ signal transmitter ST(n−1). The fourth transistor T25 includes a gate electrode connected to the first CLK node, a first electrode connected to the carry signal node, and a second electrode connected to the first buffer node Qh1. The deactivation clock ECLKB is input to the first CLK node for the second pull-up time.

The fifth transistor T26 is turned on for the first pull-up time during which the activation clock ECLK is input to the first CLK node, thereby connecting the first buffer node Qh1 to the first pull-up control node $Q1(n)$. The fifth transistor T26 includes a gate electrode connected to the first CLK node, a first electrode connected to the first buffer node Qh1, and a second electrode connected to the first pull-up control node $Q1(n)$.

The fourth and fifth transistors T25 and T26 are turned on according to the high voltage VDD of the activation clock ECLK for the first pull-up time during which the activation clock ECLK is applied to the first CLK node, thereby charging the first buffer node Qh1 and the first pull-up control node $Q1(n)$. The fourth and fifth transistors T25 and T26 are maintained in the off state for the second pull-up time during which the deactivation clock ECLKB is input to the first CLK node and a pull-down time.

When the first pull-up control node $Q1(n)$ is charged with the high voltage VDD, the sixth transistor T27 is turned on to connect a third power node to the first buffer node Qh1, thereby charging the first buffer node Qh1. The gate driving voltage GVDD is applied to the third power node. The sixth transistor T27 includes a gate electrode connected to the first pull-up control node $Q1(n)$, a first electrode connected to the third power node, and a second electrode connected to the first buffer node Qh1.

When a voltage of the first buffer node Qh1 or a voltage of a second buffer node Qh2 is a high voltage, the seventh transistor T28 is turned on to connect the pull-down control node QB(n) to a fourth power node, thereby discharging the pull-down control node QB(n). The gate reference voltage GVSS2 is applied to the fourth power node. The seventh transistor T28 includes a gate electrode connected to the first and second buffer nodes Qh1 and Qh2, a first electrode connected to the pull-down control node QB(n), and a second electrode connected to the fourth power node.

The second Q generation logic unit QG12 may include eighth to tenth transistors T29 to T31 as shown in FIGS. 10A and 10B.

The eighth transistor T29 is turned on for the second pull-up time during which the activation clock ECLK is input to the second CLK node, thereby connecting the carry signal node to the first buffer node Qh1. A carry pulse CAR(n−1) from a preceding signal transmitter is applied to the carry signal node. The eighth transistor T29 includes a gate electrode connected to a second CLK node, a first electrode connected to the carry signal node, and a second electrode connected to the second buffer node Qh2. The deactivation clock ECLKB is input to the second CLK node for the first pull-up time.

The ninth transistor T30 is turned on for the second pull-up time during which the activation clock ECLK is input to the second CLK node, thereby connecting the second buffer node Qh2 to the second pull-up control node $Q2(n)$. The ninth transistor T30 includes a gate electrode connected to the second CLK node, a first electrode connected to the second buffer node Qh2, and a second electrode connected to the second pull-up control node $Q2(n)$.

The eighth and ninth transistors T29 and T30 are turned on according to a high voltage of the activation clock ECLK for the second pull-up time during which the activation clock ECLK is applied to the second CLK node, thereby charging the second buffer node Qh2 and the second pull-up control node $Q2(n)$. The eighth and ninth transistors T29 and T30 are maintained in the off state for the first pull-up time during which the deactivation clock ECLKB is input to the second CLK node and a pull-down time.

When the second pull-up control node $Q2(n)$ is charged with a high voltage, the tenth transistor T31 is turned on to connect the third power node to the second buffer node Qh2, thereby charging the second buffer node Qh2. The gate driving voltage GVDD is applied to the third power node. The tenth transistor T31 includes a gate electrode connected to the second pull-up control node $Q2(n)$, a first electrode connected to the third power node, and a second electrode connected to the second buffer node Qh2.

The pull-up transistors TR11, TR12, TR31, and TR32 are turned on in response to voltages of the first and second pull-up control nodes $Q1(n)$ and $Q2(n)$ that are alternately charged for the first and second pull-up times, thereby charging output nodes.

The QB generation logic unit QBG charges the pull-down control node QB(n) for a pull-down time. When the pull-down control node QB(n) is charged with a high voltage, the pull-down transistors TR20 and TR40 are turned on to discharge output nodes to the gate reference voltage GVSS0 and GVSS2, respectively.

The QB generation logic unit QBG may include eleventh to fourteenth transistors T32 to T35.

The eleventh transistor T32 is turned on to connect a fifth power node to a gate electrode of the fourteenth transistor T35 when a voltage of the pull-down control node QB(n−1) of a preceding signal transmitter, e.g., the $(n-1)^{th}$ signal transmitter ST(n–1), is a high voltage, i.e., during a pull-down time. The gate driving voltage GVDD1 is applied to the fifth power node. The eleventh transistor T32 includes a gate electrode connected to a pull-down control node QB(n–1) of a preceding signal transmitter, a first electrode connected to the fifth power node, and a second electrode connected to a gate electrode of the fourteenth transistor T35.

The twelfth transistor T33 is turned on to connect the gate electrode of the fourteenth transistor T35 to a sixth power node when a voltage of the first buffer node Qh1 is a high voltage, i.e., during the first pull-up time. The gate reference voltage GVSS1 is applied to the sixth power node. The twelfth transistor T33 includes a gate electrode connected to the first buffer node Qh1, a first electrode connected to the gate electrode of the fourteenth transistor T35, and a second electrode connected to the sixth power node.

The thirteenth transistor T34 is turned on to connect the gate electrode of the fourteenth transistor T35 to the sixth power node when a voltage of the second buffer node Qh2 is a high voltage, i.e., during the second pull-up time. The thirteenth transistor T34 includes a gate electrode connected to the second buffer node Qh2, a first electrode connected to the gate electrode of the fourteenth transistor T35, and a second electrode connected to the sixth power node.

The fourteenth transistor T35 is turned on to connect the fifth power node to the pull-down control node QB(n) for a pull-down time during which a gate voltage is a high voltage, thereby charging the pull-down control node QB(n). The fourteenth transistor T35 includes a gate electrode connected to the second electrode of the eleventh transistor T32 and the first electrodes of the twelfth and thirteenth transistors T33 and T34, a first electrode connected to the fifth power node, and a second electrode connected to the pull-down control node QB(n). A first capacitor C5 may be connected between the gate electrode and the second electrode of the fourteenth transistor T35.

Figure 11:
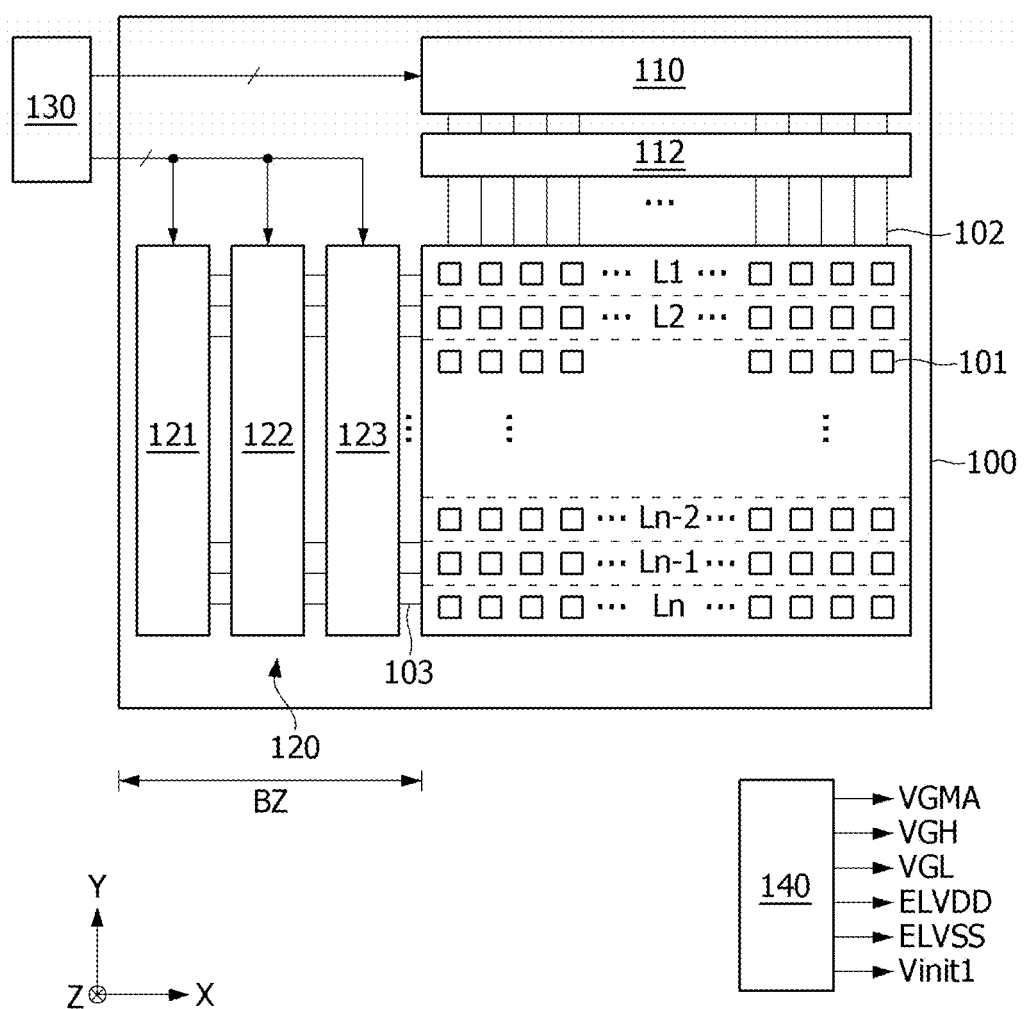
FIG. 11 is a block diagram of a display device according to an embodiment of the present disclosure.
Figure 12:
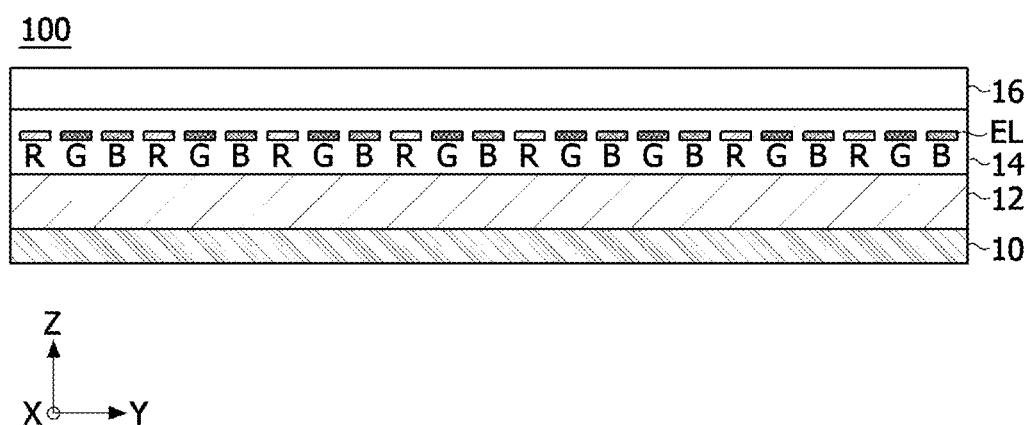
FIG. 12 is a cross-sectional view of a display panel of FIG. 11.

FIG. 11 is a block diagram of a display device according to an embodiment of the present disclosure. FIG. 12 is a cross-sectional view of a display panel of FIG. 11.

Referring to FIGS. 11 and 12, the display device according to an embodiment of the present disclosure includes a display panel 100, a display panel driver for writing pixel data to pixels of the display panel 100, and a power supply 140 for generating power necessary to drive the pixels and the display panel driver.

The display panel 100 may be a display panel of a rectangular structure having a length in an X-axis direction, a width in a Y-axis direction and a thickness in a Z-axis direction. The display panel 100 includes a pixel array that displays an input image on a screen. The pixel array includes a plurality of data lines 102, a plurality of gate lines 103 crossing the plurality of data lines 102, and pixels arranged in a matrix.

The display panel 100 may further include power lines commonly connected to the pixels. The power lines may include a power line through which a pixel driving voltage ELVDD is applied, a power line through which an initialization voltage Vinit1 is applied, and a power line through which a low potential power supply voltage ELVSS is applied.

A cross-sectional structure of the display panel 100 includes a circuit layer 12, a light-emitting element layer 14, and an encapsulation layer 16 that are stacked on a substrate 10 as shown in FIG. 12.

The circuit layer 12 may include a thin-film transistor (TFT) array including a pixel circuit connected to interconnections such as a data line, a gate line, a power line, and the like, a de-multiplexer array 112, a gate driver 120, and the like. An interconnection and circuit elements of the circuit layer 12 may include a plurality of insulating layers, two or more metal layers separated from each other with the insulating layers therebetween, and an active layer including a semiconductor material. All transistors formed in the circuit layer 12 may be embodied as n-channel oxide TFTs.

The light-emitting element layer 14 may include light-emitting elements EL driven by the pixel circuit. The light-emitting elements EL may include a red (R) light-emitting element, a green (G) light-emitting element, and a blue (B) light-emitting element. In another embodiment, the light-emitting element layer 14 may include a white light-emitting element and a color filter. The light-emitting elements EL of the light-emitting element layer 14 may be covered with a multi-layered protective layer including an organic film and an inorganic film.

The encapsulation layer 16 covers the light-emitting element layer 14 to seal the circuit layer 12 and the light-emitting element layer 14. The encapsulation layer 16 may be a multi-insulating film structure in which an organic film and an inorganic film are alternately stacked. The inorganic film blocks infiltration of moisture or oxygen. The organic film planarizes a surface of the inorganic film. When the organic film and the inorganic film are stacked in multiple layers, a moving path of moisture or oxygen is longer than that of a single layer and thus the infiltration of moisture and oxygen that may influence the light-emitting element layer 14 may be effectively blocked.

Although not shown, a touch sensor layer is formed on the encapsulation layer 16 and a polarizing plate or a color filter layer may be disposed on the touch sensor layer. The touch sensor layer may include capacitance touch sensors that sense a touch input on the basis of a change in capacitance before and after the touch input is performed. The touch sensor layer may include metal interconnection patterns and insulating films that form a capacity of the touch sensors. The insulating films may insulate intersections of the metal interconnection patterns and planarize a surface of the touch sensor layer. The polarizing plate may convert polarization of external light reflected from the metals of the touch sensor layer and the circuit layer to improve visibility and a contrast ratio. The polarizing plate may be embodied as a polarizing plate or circular polarizing plate in which a linear polarizing plate and a phase-delay film are bonded with each other. Cover glass may be adhered on the polarizing plate. The color filter layer may include red, green, and blue color filters. The color filter layer may further include a black matrix pattern. The color filter layer may absorb some light reflected from the circuit layer and the touch sensor layer instead of the polarizing plate and increase the color purity of an image reproduced on the pixel array.

The pixel array includes a plurality of pixel lines L1 to Ln. Each of the pixel lines L1 to Ln includes pixels in a row that are arranged on the pixel array of the display panel 100 in a direction of lines (X-axis direction). Pixels arranged in a pixel line share the gate lines 103. Pixels arranged in a column direction Y along a data-line direction share the same data line 102. 1 horizontal period is a time obtained by dividing a first frame period by the total number of the pixel lines L1 to Ln.

The display panel 100 may be embodied as a non-transmissive display panel or a transmissive display panel. The transmissive display panel is applicable to a transparent display device in which an image is displayed on a screen and through which a real background is visible. The display panel 100 may be manufactured as a flexible display panel.

Each pixel 101 may be divided into a red sub-pixel, a green sub-pixel, and a blue sub-pixel to realize colors. Each of the pixels 101 may further include a white sub-pixel. Each of the sub-pixels includes a pixel circuit. Hereinafter, "pixel" may be understood as having the same meaning as "sub-pixel." Each pixel circuit is connected to a data line, gate lines, and power lines.

Pixels may be arranged in the form of real-color pixels and pentile pixels. In the case of a pentile pixel, two sub-pixels of different colors are driven together as one pixel 101 using a predetermined pixel rendering algorithm to realize a higher resolution than a resolution of a real-color pixel. The pixel rendering algorithm may compensate for insufficient color representation of each pixel using colors of light emitted from adjacent pixels.

The power supply 140 generates direct-current (DC) power necessary to drive the pixel array and the display panel driver of the display panel 100 using a DC-DC converter. The DC-DC converter may include a charge pump, a regulator, a buck converter, a boost converter, and the like. The power supply 140 may adjust a level of an input DC voltage applied from a host system (not shown) to generate a DC voltage (or constant voltage) such as a gamma reference voltage VGMA, a gate-on voltage VGH, a gate-off voltage VGL, a pixel driving voltage ELVDD, a low-potential power supply voltage ELVSS, or an initialization voltage Vinit1. The gamma reference voltage VGMA is supplied to a data driver 110. The gate-on voltage VGH and the gate-off voltage VGL are supplied to the gate driver 120. The pixel driving voltage ELVDD, the low-potential power supply voltage ELVSS, and the initialization voltage Vinit1 are commonly applied to the pixels 101.

The display panel driver writes pixel data of an input image to the pixels of the display panel 100 under control of a timing controller 130.

The display panel driver includes the data driver 110 and the gate driver 120. The display panel driver may further include the de-multiplexer array 112 between the data driver 110 and the data lines 102.

The de-multiplexer array 112 sequentially applies data voltages output from channels of the data driver 110 to the data lines 102 using a plurality of de-multiplexers (DE-MUXs). The DEMUXs may include a number of switch elements on the display panel 100. When the DEMUXs are disposed between output terminals of the data driver 110 and the data lines 102, the number of channels of the data driver 110 may decrease. The de-multiplexer array 112 may be omitted.

The display panel driver may further include a touch sensor driver to drive the touch sensors. The touch sensor driver is omitted in FIG. 11. The data driver 110 and the touch sensor driver may be integrated into one drive integrated circuit (IC). In a mobile device or wearable device, the timing controller 130, the power supply 140, the data driver 110, etc. may be integrated into one drive IC.

The display panel driver may operate in a low-speed drive mode under control of the timing controller 130. The low-speed driving mode may be set to analyze an input image and reduce power consumption of the display device when a degree of change in the input image is less than a predetermined number of frames. In the low-speed driving mode, when still images are input for a certain time period or more, a refresh rate of pixels may be reduced to reduce power consumption of the display panel driver and the display panel 100. The low-speed driving mode is not limited to a case in which still images are input. For example, the display panel driver may operate in the low-speed driving mode when the display device operates in a standby mode or when a user command or an input image is not input to the display panel driver for a certain time.

The data driver 110 receives pixel data of an input image in the form of a digital signal from the timing controller 130 and outputs a data voltage. The data driver 110 generates a data voltage by converting pixel data of an input image into a gamma compensation voltage in each frame period using a digital-to-analog converter (DAC). The gamma reference voltage VGMA is divided into a gamma compensation voltage for each gradation through a partial pressure circuit. A gamma compensation voltage for each gradation is provided to the DAC of the data driver 110. The data voltage is output through an output buffer in each channel of the data driver 110.

The gate driver 120 may be embodied as a gate-in-panel (GIP) circuit formed on the circuit layer 12 on the display panel 100, together with the TFT array and the interconnections of the pixel array. The gate driver 120 may be disposed on a bezel area BZ that is a non-display area of the display panel 100 or dispersed in the pixel array on which an input image is reproduced. The gate driver 120 sequentially outputs a gate signal to the gate lines 103 under control of the timing controller 130. The gate driver 120 may shift the gate signal using a shift register and sequentially supply resultant signals to the gate lines 103. In an organic light-emitting display device, the gate signal may include a scan pulse, an EM pulse, an initialization pulse, etc.

The gate driver 120 may include a first shift register 121 for outputting a scan pulse, a second shift register 122 for outputting an EM pulse, and a third shift register 123 for outputting an initialization pulse. At least one of the shift registers 121, 122, and 123 may be embodied as a gate driving circuit such as that described in the above-described embodiments.

The timing controller 130 receives, from a host system, digital video data DATA of an input image and a timing signal that is in synchronization with the digital video data DATA. The timing signal may include a vertical synchronization signal Vsync, a horizontal synchronization signal Hsync, a clock CLK, a data enable signal DE, etc. A vertical period and a horizontal period may be identified by a method of counting a data enable signal DE and thus the vertical synchronization signal Vsync and the horizontal synchronization signal Hsync may be omitted. The data enable signal DE has a period of one horizontal period 1H.

The host system may be a television system, a tablet computer, a laptop computer, a navigation system, a personal computer (PC), a home theater system, a mobile device, a wearable device, or a vehicle system. The host system may scale an image signal from a video source to match a resolution of the display panel 100 and transmit a resultant image signal and the timing signal to the timing controller 130.

In the low-speed driving mode, the timing controller 130 reduces a frequency of a frame rate at which pixel data is written to pixels, compared to a normal driving mode. For example, in the normal driving mode, a data refresh frame frequency at which pixel data is written to pixels may occur at a refresh rate of 60 Hz or more, e.g., 60 Hz, 120 Hz or 144 Hz, and in the low-speed driving mode, a data refresh frame DRF may occur at a refresh rate of a frequency lower than that in the normal driving mode. The timing controller 130 may reduce a driving frequency of the display panel driver by reducing a frame frequency to be between 1 Hz and 30 Hz to lower a refresh rate of the pixels in the low-speed driving mode.

The timing controller 130 generates a data timing control signal for controlling an operation timing of the data driver 110, a control signal for controlling an operation timing of the de-multiplexer array 112, and a gate control signal for controlling an operation timing of the gate driver 120, based on the timing signals Vsync, Hsync, and DE received from the host system. The timing controller 130 controls the operation timing of the display panel driver to synchronize the data driver 110, the de-multiplexer array 112, the touch sensor driver, and the gate driver 120 with one another.

The gate timing control signal generated by the timing controller 130 may be input to the shift registers 121, 122, and 123 of the gate driver 120 through a level shifter (not shown). The level shifter may receive the gate timing control signal, generate a start pulse and a shift clock, and provide the start pulse and the shift clock to the shift registers 121, 122, and 123.

Due to a device characteristic deviation and a process deviation in a manufacturing process of the display panel 100, electrical characteristics of a driving element may be different for pixels and the difference may increase as a driving time of the pixels increases. To compensate for a deviation between electrical characteristics of the driving elements for the pixels, an internal compensation technique or an external compensation technique may be applied to an organic light-emitting display device. In the internal compensation technique, a threshold voltage of a driving element for each sub-pixel is sampled using an internal compensation circuit for each pixel circuit, and a gate-source voltage Vgs of the driving element is compensated for by the threshold voltage. In the external compensation technique, a current or voltage of a driving element that changes according to electrical characteristics of the driving element is sensed in real time using an external compensation circuit. In the external compensation technique, pixel data (digital data) of an input image is modified by an electrical characteristic deviation (or change) of the driving element, which is sensed in units of pixels, to compensate for the electrical characteristic deviation (or change) of the driving element for each of the pixels in real time. The display panel driver may drive pixels using the external compensation technique and/or the internal compensation technique.

Figure 13:
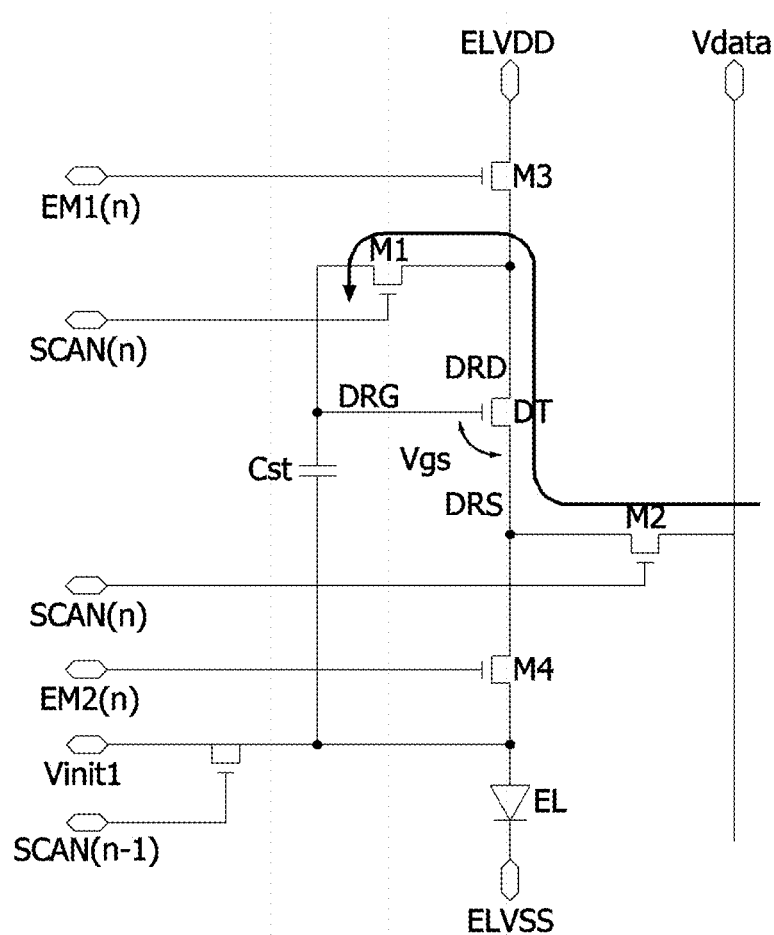
FIG. 13 is a circuit diagram of a pixel circuit according to an embodiment of the present disclosure.

FIG. 13 is a circuit diagram of a pixel circuit according to an embodiment of the present disclosure. A pixel circuit of the present disclosure may be embodied as a pixel circuit with an internal compensation circuit as shown in FIG. 13 but is not limited thereto.

Referring to FIG. 13, the pixel circuit includes a light-emitting element EL, a driving element DT, first to fifth switch elements M1 to M5, and a capacitor Cst. The driving element DT and the switch elements M1 to M5 may be embodied together as an n-channel oxide TFT.

The light-emitting element EL may include an anode electrode, a cathode electrode, and an organic compound layer connected between the anode electrode and the cathode electrode. The organic compound layer may include, but is not limited to, a hole injection layer (HIL), a hole transport layer (HTL), an emission layer (EML), an electron transport layer (ETL), and an electron injection layer (EIL). When a voltage is applied to the anode electrode and the cathode electrode, holes passing through the HTL and electrons passing through the ETL move to the EML and thus excitons are generated, thereby causing visible light to be emitted from the EML. The OLED used as the light emitting element EL may have a tandem structure in which a plurality of light emitting layers are stacked. The tandem structure of OLED can improve the luminance and lifespan of pixels.

The driving element DT generates a current for driving the light-emitting element EL according to a gate-source voltage Vgs. The driving element DT includes a gate electrode connected to a first node DRG, a first electrode connected to a second node DRD, and a second electrode connected to a third node DRS. The capacitor Cst may be connected between the first node DRG and the anode electrode of the light-emitting element EL.

The first switch element M1 includes a gate electrode to which an $n^{th}$ scan pulse SCAN(n) is applied, a first electrode connected to the first node DRG, and a second electrode connected to the second node DRD. The first switch element M1 is turned on by a gate-on voltage of the $n^{th}$ scan pulse SCAN(n) to connect the first node DRG and the second node DRD, thereby connecting the electrodes of the driving element DT in a diode connection structure.

The second switch element M2 includes a gate electrode to which the $n^{th}$ scan pulse SCAN(n) is applied, a first electrode connected to the third node DRS, and a second electrode connected to a data line to which a data voltage Vdata is applied. The second switch element M2 is turned on by the gate-on voltage of the $n^{th}$ scan pulse SCAN(n) to supply the data voltage Vdata to the third node DRS.

The third switch element M3 includes a gate electrode to which a first EM pulse EM1(n) is applied, a first electrode to which a pixel driving voltage ELVDD is applied, and a second electrode connected to the second node DRD. The third switch element M3 is turned on by a gate-on voltage of the first EM pulse EM1(n) to supply the pixel driving voltage ELVDD to the second node DRD.

The fourth switch element M4 includes a gate electrode to which a second EM pulse EM2(n) is applied, a first electrode connected to the third node DRS, and a second electrode connected to the anode electrode of the light-emitting element EL. The fourth switch element M4 is turned on by the gate-on voltage of the second EM pulse EM2(n) to connect the third node DRS to the anode electrode of the light-emitting element EL.

The fifth switch element M5 includes a gate electrode to which an $(n-1)^{th}$ scan pulse SCAN(n−1) is applied, a first electrode connected to a power node to which an initialization voltage Vinit1 is applied, and a second electrode connected to the anode electrode of the light-emitting element EL. The fifth switch element M5 is turned on by a gate-on voltage of the $(n-1)^{th}$ scan pulse SCAN(n−1) to supply the initialization voltage Vinit1 to the anode electrode of the light-emitting element EL.

A gate driving circuit and a display device including the same according to embodiments of the present disclosure may be described as follows.

A gate driving circuit comprises a plurality of signal transmitters configured to charge or discharge a first control node and a second control node, wherein a start signal and a shift clock are input to the plurality of signal transmitters; and first buffers each connected to one of the plurality of signal transmitters. Each of the first buffers comprises a first transistor configured to be driven by a voltage of the first control node; and a second transistor configured to be driven by a voltage of the second control node, and connected to the first transistor with a first output node, for outputting a gate pulse, between the first and second transistors. The plurality of signal transmitters comprise a first controller configured to control the first control node to act as a pull-up control node to turn on the first transistor when an activation clock is input to the first controller for a first unit time, and to be deactivated when a deactivation clock is input thereto for a second unit time; and a second controller configured to control the second control node to act as the pull-up control node to turn on the second transistor when the activation clock is input to the second controller for the second unit time, and to be deactivated when the deactivation clock is input thereto for the first unit time.

A gate driving circuit comprises a plurality of signal transmitters configured to charge or discharge a first pull-up control node, a second pull-up control node, and a pull-down control node, wherein a start signal and a shift clock are input to the plurality of signal transmitters; and first buffers each connected to one of the plurality of signal transmitters. Each of the first buffers comprises a 1-1 pull-up transistor configured to be driven by a voltage of the first pull-up control node; a 1-2 pull-up transistor configured to be driven by a voltage of the second pull-up control node; and a first pull-down transistor configured to be driven by a voltage of the pull-down control node. The plurality of signal transmitters comprise a first Q generation logic unit configured to charge the first pull-up control node to turn on the 1-1 pull-up transistor when an activation clock is input to the first Q generation logic unit for a first pull-up time, and to be deactivated when a deactivation clock is input to the first Q generation logic unit for a second pull-up time; a second Q generation logic unit configured to charge the second pull-up control node to turn on the 1-2 pull-up transistor when the activation clock is input to the second Q generation logic unit for the second pull-up time, and to be deactivated when the deactivation clock is input to the second Q generation logic unit for the first pull-up time; and a QB generation logic unit configured to charge the pull-down control node to turn on the first pull-down transistor for a pull-down time during which the first and second pull-up control nodes are discharged.

A display device comprises a display panel on which a plurality of data lines to which a data voltage is applied, a plurality of gate lines which cross the plurality of data lines and to which a gate signal is applied, and pixels connected to a plurality of power lines are disposed; a data driving circuit configured to receive pixel data and output the data voltage; and a gate driving circuit configured to output the gate signal using a shift register. The shift register of the gate driving circuit comprises a plurality of signal transmitters configured to charge or discharge a first control node and a second control node, wherein a start signal and a shift clock are input to the plurality of signal transmitters; and buffers each connected to one of the plurality of signal transmitters. Each of the buffers comprises a first transistor configured to be driven by a voltage of the first control node; and a second transistor configured to be driven by a voltage of the second control node, and connected to the first transistor with a first output node between the first and second transistors. The plurality of signal transmitters comprise a first controller configured to control the first control node to act as a pull-up control node to turn on the first transistor when an activation clock is input to the first controller for a first unit time, and to be deactivated when a deactivation clock is input to the first controller for a second unit time; and a second controller configured to control the second control node to act as the pull-up control node to turn on the second transistor when the activation clock is input to the second controller for the second unit time, and to be deactivated when the deactivation clock is input to the second controller for the first unit time.

A display device comprises a display panel on which a plurality of data lines to which a data voltage is applied, a plurality of gate lines which cross the plurality of data lines and to which a gate signal is applied, and pixels connected to a plurality of power lines are disposed; a data driving circuit configured to receive pixel data and output the data voltage; and a gate driving circuit configured to output the gate signal using a shift register. The shift register of the gate driving circuit comprises a plurality of signal transmitters configured to charge or discharge a first pull-up control node, a second pull-up control node, and a pull-down control node, wherein a start signal and a shift clock are input to the plurality of signal transmitters; and first buffers each connected to one of the plurality of signal transmitters. Each of the first buffers comprises a 1-1 pull-up transistor configured to be driven by a voltage of the first pull-up control node; a 1-2 pull-up transistor configured to be driven by a voltage of the second pull-up control node; and a first pull-down transistor configured to be driven by a voltage of the pull-down control node, and the plurality of signal transmitters comprise: a first Q generation logic unit configured to charge the first pull-up control node to turn on the 1-1 pull-up transistor when an activation clock is input to the first Q generation logic unit for a first pull-up time, and to be deactivated when a deactivation clock is input to the first Q generation logic unit for a second pull-up time; a second Q generation logic unit configured to charge the second pull-up control node to turn on the 1-2 pull-up transistor when the activation clock is input to the second Q generation logic unit for the second pull-up time, and to be deactivated when the deactivation clock is input to the second Q generation logic unit for the first pull-up time; and a QB generation logic unit configured to charge the pull-down control node to turn on the first pull-down transistor for a pull-down time during which the first and second pull-up control nodes are discharged.

According to the present disclosure, first and second control nodes may be alternately controlled to act as a pull-up control node and a pull-down control node or two pull-up control nodes may be alternately activated to achieve a narrow bezel of a display device and reduce stress on buffer transistors of a gate driving circuit.

Effects of the present disclosure are not limited thereto and other effects that are not described here will be clearly understood by those of ordinary skill in the art from the following claims.

The objects to be achieved by the present disclosure, the means for achieving the objects, and effects of the present disclosure described above do not specify essential features of the claims, and thus, the scope of the claims is not limited to the specific description of the present disclosure.

It will be apparent to those skilled in the art that various modifications and variations can be made in the gate driving circuit and the display device including the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A gate driving circuit comprising:
  a plurality of signal transmitters configured to charge or discharge a first control node and a second control node, wherein a start signal and a shift clock are input to the plurality of signal transmitters; and
  first buffers each connected to one of the plurality of signal transmitters, wherein each of the first buffers comprises:
a first transistor configured to be driven by a voltage of the first control node; and
a second transistor configured to be driven by a voltage of the second control node, and connected to the first transistor with a first output node, for outputting a gate pulse, between the first and second transistors, and
the plurality of signal transmitters comprise:
a first controller configured to control the first control node to act as a pull-up control node to turn on the first transistor when an activation clock is input to the first controller for a first unit time, and to be deactivated when a deactivation clock is input thereto for a second unit time; and
a second controller configured to control the second control node to act as the pull-up control node to turn on the second transistor when the activation clock is input to the second controller for the second unit time, and to be deactivated when the deactivation clock is input thereto for the first unit time.

2. The gate driving circuit of claim 1, further comprising second buffers each connected to one of the plurality of signal transmitters,
wherein each of the second buffers comprises:
a third transistor configured to be driven by a voltage of the first control node; and
a fourth transistor configured to be driven by a voltage of the second control node, and connected to the third transistor with a second output node for outputting a carry pulse between the third and fourth transistors,
a power supply voltage applied to the first and second transistors is periodically switched at at least one of the first buffers, and
a power supply voltage applied to the third and fourth transistors is periodically switched at at least one of the second buffers.

3. The gate driving circuit of claim 1, wherein the first transistor comprises a gate electrode connected to the first control node, a first electrode connected to a first power node, and a second electrode connected to the first output node,
the second transistor comprises a gate electrode connected to the second control node, a first electrode connected the first output node, and a second electrode connected to a second power node, and
voltages applied to the first power node and the second power node are switched between a gate driving voltage and a gate reference voltage at intervals of a predetermined time.

4. The gate driving circuit of claim 3, wherein the gate driving voltage is applied to the first power node for the first unit time and the gate reference voltage is applied to the first power node for the second unit time,
the gate reference voltage is applied to the second power node for the first unit time and the gate driving voltage is applied to the second power node for the second unit time,
for the first unit time, the first transistor operates as a pull-up transistor and the second transistor operates as a pull-down transistor, and
for the second unit time, the second transistor operates as a pull-up transistor and the first transistor operates as a pull-down transistor.

5. The gate driving circuit of claim 1, wherein the activation clock comprises a plurality of pulses that swing between a high voltage and a low voltage for a unit time, and the deactivation clock is maintained at the low voltage for the unit time.

6. The gate driving circuit of claim 5, wherein the first controller comprises:
a first Q generation logic unit configured to control the first control node to act as the pull-up control node by charging the first control node for the first unit time; and
a first QB generation logic unit configured to control the second control node to act as a pull-down control node by charging the second control node when the first control node is discharged for the first unit time, and
the second controller comprises:
a second Q generation logic unit configured to control the second control node to act as the pull-up control node by charging the second control node for the second unit time; and
a second QB generation logic unit configured to control the first control node to act as the pull-down control node by charging the first control node when the second control node is discharged for the second unit time.

7. The gate driving circuit of claim 6, wherein the first Q generation logic unit comprises a fifth transistor, a sixth transistor, a seventh transistor, and an eighth transistor,
wherein the fifth transistor comprises a gate electrode connected to a first CLK node to which the activation clock is applied for the first unit time and the deactivation clock is applied for the second unit time, a first electrode connected to a carry signal node to which a carry pulse from a preceding signal transmitter is input, and a second electrode connected to a first buffer node,
the sixth transistor comprises a gate electrode connected to the first CLK node, a first electrode connected to the first buffer node, and a second electrode connected to the first control node,
the seventh transistor comprises a gate electrode connected to the first control node, a first electrode connected to a fifth power node to which the gate driving voltage is applied for the first unit time and the gate reference voltage is applied for the second unit time, and a second electrode connected to the first buffer node, and
the eighth transistor comprises a gate electrode connected to a second buffer node, a first electrode connected to a sixth power node to which the gate reference voltage is applied, and a second electrode connected to the first control node, and
the first QB generation logic unit comprises a ninth transistor, a tenth transistor, and an eleventh transistor,
wherein the ninth transistor comprises a gate electrode connected to a second control node of the preceding signal transmitter, a first electrode connected to a seventh power node to which the gate driving voltage is applied for the first unit time and the gate reference voltage is applied for the second unit time, and a second electrode connected to a gate electrode of the eleventh transistor,
the tenth transistor comprises a gate electrode connected to the first buffer node, a first electrode connected to the gate electrode of the eleventh transistor, and a second electrode connected to a tenth power node to which the gate reference voltage is applied, and
the eleventh transistor comprises a gate electrode connected to the second electrode of the ninth transistor and the first electrode of the tenth transistor, a first electrode connected to an eleventh power node to which the gate driving voltage is applied, and a second electrode connected to the second control node.

8. The gate driving circuit of claim 7, wherein the second Q generation logic unit comprises a twelfth transistor, a thirteenth transistor, a fourteenth transistor, and a fifteenth transistor,
- wherein the twelfth transistor comprises a gate electrode connected to a second CLK node to which the deactivate clock is input for the first unit time and the activate clock is input for the second unit time, a first electrode connected to the carry signal node, and a second electrode connected to the second buffer node,
- the thirteenth transistor comprises a gate electrode connected to the second CLK node, a first electrode connected to the second buffer node, and a second electrode connected to the second control node,
- the fourteenth transistor comprises a gate electrode connected to the second control node, a first electrode connected to a twelfth power node to which the gate reference voltage is applied for the first unit time and the gate driving voltage is applied for the second unit time, and a second electrode connected to the second buffer node, and
- the fifteenth transistor comprises a gate electrode connected to the first buffer node, a first electrode connected to the sixth power node, and a second electrode connected to the second control node, and
- the second QB generation logic unit comprises a sixteenth transistor, a seventeenth transistor, and an eighteenth transistor,
- wherein the sixteenth transistor comprises a gate electrode connected to a first control node of the preceding signal transmitter, a first electrode connected to a thirteenth power node to which the gate reference voltage is applied for the first unit time and the gate driving voltage is applied for the second unit time, and a second electrode connected to a gate electrode of the eighteenth transistor,
- the seventeenth transistor comprises a gate electrode connected to the second buffer node, a first electrode connected to the gate electrode of the eighteenth transistor, and a second electrode connected to the tenth power node, and
- the eighteenth transistor comprises a gate electrode connected to the second electrode of the sixteenth transistor and the first electrode of the seventeenth transistor, a first electrode connected to the eleventh power node, and a second electrode connected to the first control node.

9. The gate driving circuit of claim 1, wherein the first unit time is an odd-numbered unit time and the second unit time is an even-numbered unit time.

10. The gate driving circuit of claim 3, wherein a third capacitor is connected between the gate electrode and the second electrode of the first transistor, and a fourth capacitor is connected between the gate electrode and the first electrode of the second transistor.

11. The gate driving circuit of claim 7, wherein a first capacitor is connected between the gate electrode and the second electrode of the eleventh transistor.

12. The gate driving circuit of claim 8, wherein a second capacitor is connected between the gate electrode and the second electrode of the eighteenth transistor.

13. A gate driving circuit comprising:
- a plurality of signal transmitters configured to charge or discharge a first pull-up control node, a second pull-up control node, and a pull-down control node, wherein a start signal and a shift clock are input to the plurality of signal transmitters; and
- first buffers each connected to one of the plurality of signal transmitters,
- wherein each of the first buffers comprises:
  - a 1-1 pull-up transistor configured to be driven by a voltage of the first pull-up control node;
  - a 1-2 pull-up transistor configured to be driven by a voltage of the second pull-up control node; and
  - a first pull-down transistor configured to be driven by a voltage of the pull-down control node, and
- the plurality of signal transmitters comprise:
  - a first Q generation logic unit configured to charge the first pull-up control node to turn on the 1-1 pull-up transistor when an activation clock is input to the first Q generation logic unit for a first pull-up time, and to be deactivated when a deactivation clock is input to the first Q generation logic unit for a second pull-up time;
  - a second Q generation logic unit configured to charge the second pull-up control node to turn on the 1-2 pull-up transistor when the activation clock is input to the second Q generation logic unit for the second pull-up time, and to be deactivated when the deactivation clock is input to the second Q generation logic unit for the first pull-up time; and
  - a QB generation logic unit configured to charge the pull-down control node to turn on the first pull-down transistor for a pull-down time during which the first and second pull-up control nodes are discharged.

14. The gate driving circuit of claim 13, further comprising second buffers each connected to one of the plurality of signal transmitters,
- wherein each of the second buffers comprises:
  - a 3-1 pull-up transistor configured to be driven by a voltage of the first pull-up control node;
  - a 3-2 pull-up transistor configured to be driven by a voltage of the second pull-up control node; and
  - a second pull-down transistor configured to be driven by a voltage of the pull-down control node.

15. The gate driving circuit of claim 14, wherein the first Q generation logic unit comprises a fourth transistor, a fifth transistor, a sixth transistor, and a seventh transistor,
- wherein the fourth transistor comprises a gate electrode connected to a first CLK node to which the activation clock is applied for the first pull-up time and the deactivation clock is applied for the second pull-up time, a first electrode connected to a carry signal node to which a carry pulse from a preceding signal transmitter is input, and a second electrode connected to a first buffer node,
- the fifth transistor comprises a gate electrode connected to the first CLK node, a first electrode connected to the first buffer node, and a second electrode connected to the first pull-up control node,
- the sixth transistor comprises a gate electrode connected to the first pull-up control node, a first electrode connected to a third power node to which a gate driving voltage is applied, and a second electrode connected to the first buffer node, and
- the seventh transistor comprises a gate electrode connected to the first buffer node and a second buffer node, a first electrode connected to the pull-down control node, and a second electrode connected to a fourth power node to which a gate reference voltage is applied, and the second Q generation logic unit comprises an eighth transistor, a ninth transistor, and a tenth transistor, wherein the eighth transistor comprises a gate electrode connected to a second CLK node to which the activation clock is input for the second pull-up time and the deactivate clock is input for the first pull-up time, a first electrode connected to the carry signal node, and a second electrode connected to the second buffer node, the ninth transistor comprises a gate electrode connected to the second CLK node, a first electrode connected to the second buffer node, and a second electrode connected to the second pull-up control node, and the tenth transistor comprises a gate electrode connected to the second pull-up control node, a first electrode connected to the third power node, and a second electrode connected to the second buffer node.

16. The gate driving circuit of claim 15, wherein the QB generation logic unit comprises an eleventh transistor, a twelfth transistor, a thirteenth transistor, and a fourteenth transistor, the eleventh transistor comprises a gate electrode connected to a pull-down control node of the preceding signal transmitter, a first electrode connected to a fifth power node to which the gate driving voltage is applied, and a second electrode connected to a gate electrode of the fourteenth transistor, the twelfth transistor comprises a gate electrode connected to the first buffer node, a first electrode connected to the gate electrode of the fourteenth transistor, and a second electrode connected to a sixth power node to which the gate reference voltage is applied, the thirteenth transistor comprises a gate electrode connected to the second buffer node, a first electrode connected to the gate electrode of the fourteenth transistor, and a second electrode connected to the sixth power node, and the fourteenth transistor comprises a gate electrode connected to the second electrode of the eleventh transistor and the first electrodes of the twelfth and thirteenth transistors, a first electrode connected to the fifth power node, and a second electrode connected to the pull-down control node.

17. The gate driving circuit of claim 14, wherein the 1-1 pull-up transistor includes a gate electrode connected to the first pull-up control node, a first electrode connected to a first power node, and a second electrode connected to a first output node, the 1-2 pull-up transistor includes a gate electrode connected to the second pull-up control node, a first electrode connected to the first power node, and a second electrode connected to the first output node, the first pull-down transistor includes a gate electrode connected to the pull-down control node, a first electrode connected to the first output node, and a second electrode connected to a second power node, wherein a gate driving voltage is applied to the first power node, and a gate reference voltage is applied to the second power node.

18. The gate driving circuit of claim 17, wherein a second capacitor is connected between the gate electrode and the second electrode of the 1-1 pull-up transistor, and a third capacitor is connected between the gate electrode and the second electrode of the 1-2 pull-up transistor.

19. The gate driving circuit of claim 16, wherein a first capacitor is connected between the gate electrode and the second electrode of the fourteenth transistor.

20. The gate driving circuit of claim 17, wherein the 3-1 pull-up transistor includes a gate electrode connected to the first pull-up control node, a first electrode connected to the first power node, and a second electrode connected to a second output node, the 3-2 pull-up transistor includes a gate electrode connected to the second pull-up control node, a first electrode connected to the first power node, and a second electrode connected to the second output node, the second pull-down transistor includes a gate electrode connected to the pull-down control node, a first electrode connected to the second output node, and a second electrode connected to the second power node.

\* \* \* \* \*